US010862624B2

(12) United States Patent
Carvalho et al.

(10) Patent No.: US 10,862,624 B2
(45) Date of Patent: Dec. 8, 2020

(54) DYNAMIC SCALING OF CHANNEL STATE INFORMATION

(71) Applicant: Imagination Technologies Limited, Kings Langley (GB)

(72) Inventors: Filipe Carvalho, Chepstow (GB); Paul Murrin, Chepstow (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 16/457,954

(22) Filed: Jun. 29, 2019

(65) Prior Publication Data
US 2020/0007273 A1 Jan. 2, 2020

(30) Foreign Application Priority Data

Jun. 29, 2018 (GB) .................................. 1810782.1

(51) Int. Cl.
*H04L 1/00* (2006.01)
*H04L 1/24* (2006.01)

(52) U.S. Cl.
CPC .......... *H04L 1/0047* (2013.01); *H04L 1/0057* (2013.01); *H04L 1/24* (2013.01)

(58) Field of Classification Search
CPC ....... H04L 1/0047; H04L 1/0057; H04L 1/24; H04L 1/005; H04L 1/0026; H04L 1/0045; H04L 27/38; H03M 13/6337; H03M 13/658; H03M 13/1111
See application file for complete search history.

(56) References Cited

U.S. PATENT DOCUMENTS

| 6,549,544 | B1* | 4/2003 | Kroeger | H04L 25/0226 370/482 |
|---|---|---|---|---|
| 2003/0104797 | A1* | 6/2003 | Webster | H04L 25/03159 455/296 |
| 2004/0218519 | A1* | 11/2004 | Chiou | H04L 1/20 370/203 |
| 2007/0030913 | A1* | 2/2007 | Lin | H04L 1/0047 375/260 |
| 2007/0217533 | A1 | 9/2007 | Hwang et al. | |
| 2013/0115903 | A1 | 5/2013 | Kroeger et al. | |
| 2017/0093428 | A1 | 3/2017 | Yen et al. | |

FOREIGN PATENT DOCUMENTS

| EP | 2204984 A1 | 7/2010 |
| EP | 2461532 A2 | 6/2012 |

OTHER PUBLICATIONS

Extended European Search Report dated Nov. 18, 2019, in corresponding European Application No. 19183106.4.

\* cited by examiner

*Primary Examiner* — Jean B Corrielus
(74) *Attorney, Agent, or Firm* — Potomac Law Group, PLLC; Vincent M DeLuca

(57) ABSTRACT

Channel state information (CSI) scaling modules for use in a demodulator configured to demodulate a signal received over a transmission channel, the demodulator comprising a soft decision error corrector (e.g. LDPC decoder) configured to decode data carried on data symbols of the received signal based on CSI values. The CSI scaling module is configured to monitor the performance of the soft decision error corrector and in response to determining the performance of the soft decision error corrector is below a predetermined level, dynamically select a new CSI scaling factor based on the performance of the soft decision error corrector.

20 Claims, 14 Drawing Sheets

DYNAMIC SCALING OF CHANNEL STATE INFORMATION

BACKGROUND

Orthogonal frequency-division multiplexing (OFDM) is a multi-carrier modulation (MCM) technique in which a single data stream is transmitted over a number of lower rate orthogonal sub-carriers. An OFDM signal is generated from a serial stream of binary digits by dividing the input stream into N parallel streams. Each stream is mapped to a symbol stream using a modulation scheme, such as QAM (Quadrature Amplitude Modulation), PSK (Phase-Shift Keying) or QPSK (Quadrature Phase-Shift Keying). The orthogonality reduces co-channel interference and the multiple carriers minimises loss due to selective interference. In coded OFDM (COFDM), forward error correction (FEC) and time/frequency interleaving are applied to the signal being transmitted. As is known to those of skill in the art, when FEC is used the sender encodes the message in a redundant way by using an error-correcting code (ECC). The redundancy allows the receiver to detect a limited number of errors that may occur in the message and correct these errors without retransmission.

In many COFDM systems the receiver generates channel state information (CSI) for each received data symbol that quantifies the level of confidence attributed to the data carried by that symbol. Accordingly, the CSI constitutes an a priori probability that the corresponding data symbol is not correct or has an error. Typically, the lower the CSI the lower the confidence attributed to the data carried by a symbol, and, the higher the CSI the higher the confidence attributed to the data carried by a symbol. The channel state information is then used to decode or retrieve the original data stream from the received data stream. For example, in a Digital Video Broadcasting—Second Generation Terrestrial (DVB-T2) system the CSI is used for soft-decision decoding of the complex values transmitted via the data symbols. Specifically, the soft decision error corrector typically gives higher weight to those data symbols that have a higher CSI and lower weight to those data symbols that have a lower CSI.

The CSI for data in a particular OFDM symbol is typically based on the estimated transmission/channel conditions associated with that symbol and a predetermined scaling factor which is based on the modulation scheme (e.g. QAM, PSK, and QPSK). While this method of generating the CSI has proven effective for most transmission conditions there are situations where generating the CSI in this manner will not accurately reflect the transmission/channel conditions.

The embodiments described below are provided by way of example only and are not limiting of implementations which solve any or all of the disadvantages of known COFDM receivers.

SUMMARY

This summary is provided to introduce a selection of concepts that are further described below in the detailed description. This summary is not intended to identify key features or essential features of the claimed subject matter, nor is it intended to be used to limit the scope of the claimed subject matter.

Described herein are channel state information (CSI) scaling modules for use in a demodulator configured to demodulate a signal received over a transmission channel, the demodulator comprising a soft decision error corrector (e.g. LDPC decoder) configured to decode data carried on data symbols of the received signal based on CSI values associated with the data symbols. The CSI scaling modules are configured to monitor the performance of the soft decision error corrector and in response to determining the performance of the soft decision error corrector is below a predetermined level, dynamically select a new CSI scaling factor based on the performance of the soft decision error corrector.

A first aspect provides a channel state information "CSI" scaling module for use in demodulator configured to demodulate a signal received over a transmission channel, the demodulator comprising a soft decision error corrector configured to decode data carried on data symbols of the received signal based on CSI values associated with the data symbols, the CSI scaling module comprising: a scaling module configured to apply a scaling factor to CSI values to generate scaled CSI values and provide the scaled CSI values to the soft decision error corrector; a control module configured to: monitor performance of the soft decision error corrector; and in response to determining the performance of the soft decision error corrector is below a predetermined level, activate one of one or more CSI scaling factor selectors; and the one or more CSI scaling factor selectors, each CSI scaling factor selector configured to, in response to being activated, dynamically select a new CSI scaling factor based on the performance of the soft decision error corrector.

A second aspect provides a demodulator comprising the CSI scaling module of the first aspect.

A third aspect provides a method for automatically scaling channel state information "CSI" comprising: monitoring a performance of a soft decision error corrector of a demodulator configured to demodulate a signal received over a transmission channel, the soft decision error corrector configured to decode data carried on data symbols of the received signal based on CSI values associated with the data symbols; determining whether the performance of the soft decision error corrector is below a predetermined level; in response to determining that the performance of the soft decision error corrector is below a predetermined level, dynamically selecting a new CSI scaling factor; applying the new CSI scaling factor to the CSI values to generate scaled CSI values; and providing the scaled CSI values to the soft decision error corrector.

The CSI scaling modules and demodulators described herein may be embodied in hardware on an integrated circuit. There may be provided a method of manufacturing, at an integrated circuit manufacturing system, the CSI scaling modules or the demodulators described herein. There may be provided an integrated circuit definition dataset that, when processed in an integrated circuit manufacturing system, configures the system to manufacture the CSI scaling module or the demodulator. There may be provided a non-transitory computer readable storage medium having stored thereon a computer readable description of a CSI scaling module or a demodulator that, when processed in an integrated circuit manufacturing system, causes the integrated circuit manufacturing system to manufacture an integrated circuit embodying a CSI scaling module or a demodulator.

There may be provided an integrated circuit manufacturing system comprising: a non-transitory computer readable storage medium having stored thereon a computer readable description of the CSI scaling module or the demodulator; a layout processing system configured to process the computer readable description so as to generate a circuit layout description of an integrated circuit embodying the CSI scaling module or the demodulator; and an integrated circuit generation system configured to manufacture the CSI scaling module or the demodulator according to the circuit layout description.

There may be provided computer program code for performing a method as described herein. There may be provided non-transitory computer readable storage medium having stored thereon computer readable instructions that, when executed at a computer system, cause the computer system to perform the methods as described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
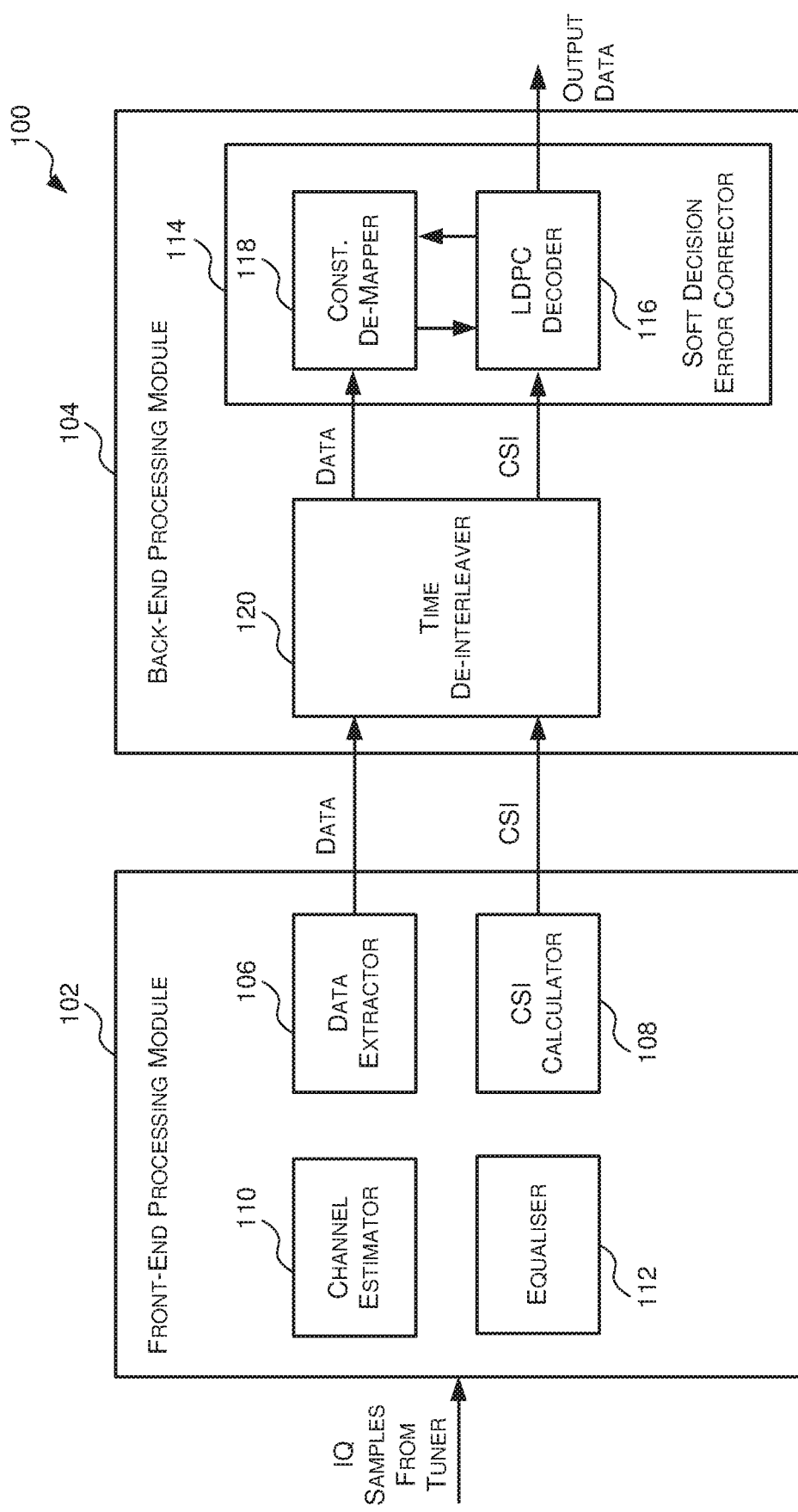
FIG. 1 is a block diagram of an example COFDM demodulator that is known to the Applicant.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments are described by way of example only.

As described above, the CSI for data in a particular symbol is typically based on the estimated transmission/channel conditions associated with that symbol and a predetermined scaling factor which is based on the modulation scheme (e.g. QAM, PSK, and QPSK). While this method of generating the CSI has proven effective for most transmission conditions there are situations where generating the CSI in this manner will not accurately reflect the transmission/channel conditions.

To more clearly explain this, reference is first made to FIG. 1 which illustrates an example demodulator 100 for a COFDM system, such as a DVB-T2 system, that generates and uses CSI values to extract the initial data stream from a received DVB-T2 signal. At a COFDM receiver a tuner (not shown) captures a radio frequency (RF) COFDM signal, down-converts the received RF signal to an intermediate frequency (IF) or baseband for processing and converts the down-converted signal into a digital signal (i.e. a series of I/Q values). The digital representation of the received RF signal (i.e. I/Q samples) is then provided to a demodulator, such as the demodulator 100 of FIG. 1, which extracts the original data stream (e.g. compressed digital audio and/or video stream) from the digital representation of the RF signal (e.g. the I/Q samples).

As shown in FIG. 1, the demodulator 100 may comprise a front-end processing module 102 and a back-end processing module 104. The front-end processing module 102 is configured to identify the ODFM symbols in the stream of I/Q values and extract the data carried thereon. The front-end processing module 102 may comprise a data extractor 106 which is configured to extract the data (i.e. complex values) from the identified OFDM data symbols and a CSI calculator 108 that is configured to generate a CSI value for each identified OFDM data cell. As is known to those of skill in the art, in OFDM systems each OFDM symbol is formed by mapping data onto a plurality of sub-carrier frequencies or cells. The front-end processing module 102 may comprise other modules such as a channel estimator 110 and an equaliser 112 which aid in the data extraction and/or CSI calculation. For example, as described in more detail below, the CSI calculator 108 may be configured to generate the CSI values from the channel estimate.

The back-end processing module 104 is configured to obtain the original data stream (e.g. the original compressed digital audio and/or video stream) from the data extracted from the OFDM data symbols using the CSI values generated by the CSI calculator 108. For example, the CSI values may be provided to a soft-decision error corrector 114 which obtains the original data stream from the data extracted from the OFDM symbols via soft decision decoding using the CSI values. As is known to those of skill in the art, soft decision decoding is a type of decoding method which decodes data that has been encoded with an error correcting code (ECC). In DVB-T2 the data may be encoded using a concatenated encoding such as low density parity check (LDPC) encoding. As is known to those of skill in the art, LDPC codes are a class of linear block codes made from many single parity check (SPC) codes. Accordingly, the soft decision error corrector may comprise an LDPC decoder 116. Some COFDM systems, such as DVB-T2 systems, support rotated constellations in order to improve the robustness where the constellation points are rotated in the complex plane.

Accordingly, the soft-decision error corrector 114 may also comprise a constellation de-mapper 118.

Some COFDM systems, such as DVB-T2 support time-interleaving. As is known to those of skill in the art, interleaving spreads source symbols across several code words to mitigate the effect of burst errors. Specifically, the resultant error distribution is more uniform such that the number of errors in one code word remains within the error correcting code's capability. In DVB-T2 the FEC blocks are grouped into time-interleaving blocks for interleaving purposes. Time interleaving is then performed on the time interleaving blocks. Each interleaving block is either mapped onto one T2-frame or spread out over several T2 frames. Accordingly, the demodulator 100 may also comprise a time de-interleaver (TDI) 120 that is configured to de-interleave the received data and corresponding CSI values. The original data stream generated by the back-end processing module 104 may be provided to a decoder (not shown) which decodes the data stream. It will be evident to a person of skill in the art that this is an example demodulator only.

The CSI is typically based on the channel properties of the communication link so that it reflects the quality of the received symbol. For example, in some cases the CSI value for a data symbol may be a scaled version of the estimated signal-to-noise ratio (SNR). In other words, the CSI may be obtained from the ratio of the estimate of the signal and noise powers for the data symbol. The scale may be selected based on the constellation used on the data symbols.

Figure 2:
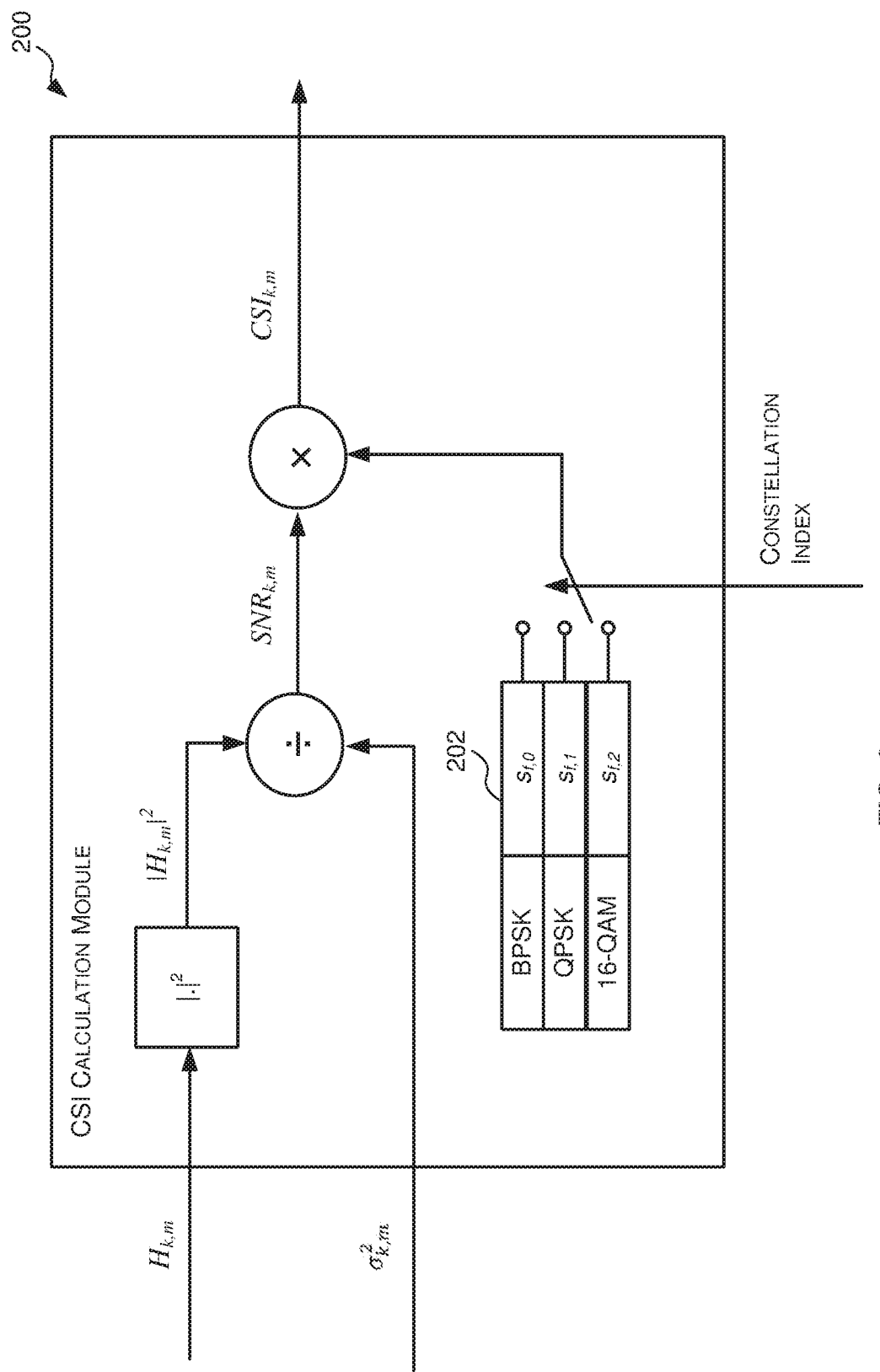
FIG. 2 is a block diagram of an example CSI calculator that is known to the Applicant.

Reference is now made to FIG. 2 which illustrates an example CSI calculator 200 which may be used to implement the CSI calculator 108 of FIG. 1. The CSI calculator 200 of FIG. 2 is configured to calculate the $CSI_{k,m}$ for a data cell (defined by frequency k) of an OFDM data symbol m by estimating the $SNR_{k,m}$ for the cell as the ratio of the square of the absolute value of the channel estimate $H_{k,m}$ for the cell, and the estimate of the noise variance $\sigma_{k,m}^2$ for the cell. A scaling factor $s_f$ is then applied to the SNR estimate $SNR_{k,m}$ to generate the $CSI_{k,m}$ for the cell. In the example of FIG. 2 the scaling factor is selected as a function of the constellation used on the data cells. For example, the CSI calculator 200 may comprise a look-up table 202 that comprises a scaling factor for each possible constellation and the appropriate scaling factor may be selected from the table 202 using a constellation index which identifies the constellation used on the data cells. For example, the look-up table 202 of FIG. 2 comprises a first scaling factor $s_{f,0}$ which is to be used when BPSK is used, a second scaling factor $s_{f,1}$ which is to be used when QPSK is used, and a third scaling factor $s_{f,2}$ which is to be used when 16-QAM is to be used.

The scaling factor for each constellation is typically obtained empirically. For example, the scaling factor for each constellation may be optimised for different transmission conditions and the scaling factor that is the optimum or close to the optimum for most transmission conditions may be selected. However, the selected scaling factors may not be optimal for all transmission conditions.

For example, as described above, in OFDM systems each OFDM symbol is formed by mapping data onto a plurality of sub-carrier frequencies or cells. However, not all of the cells are used to transmit data. Various cells, referred to as pilot cells, within an OFDM frame are modulated with reference information that is known to the receiver. These cells are then transmitted at "boosted" power levels. The channel and noise are typically estimated from the pilots. In other words, the transmission conditions on the pilot cells are typically used as a proxy for the transmission conditions on the data cells. However, in some cases the transmission conditions on the pilot cells may not match the transmission conditions on the data cells resulting in CSI values that do not reflect the transmission conditions on the data cells.

Figure 3:
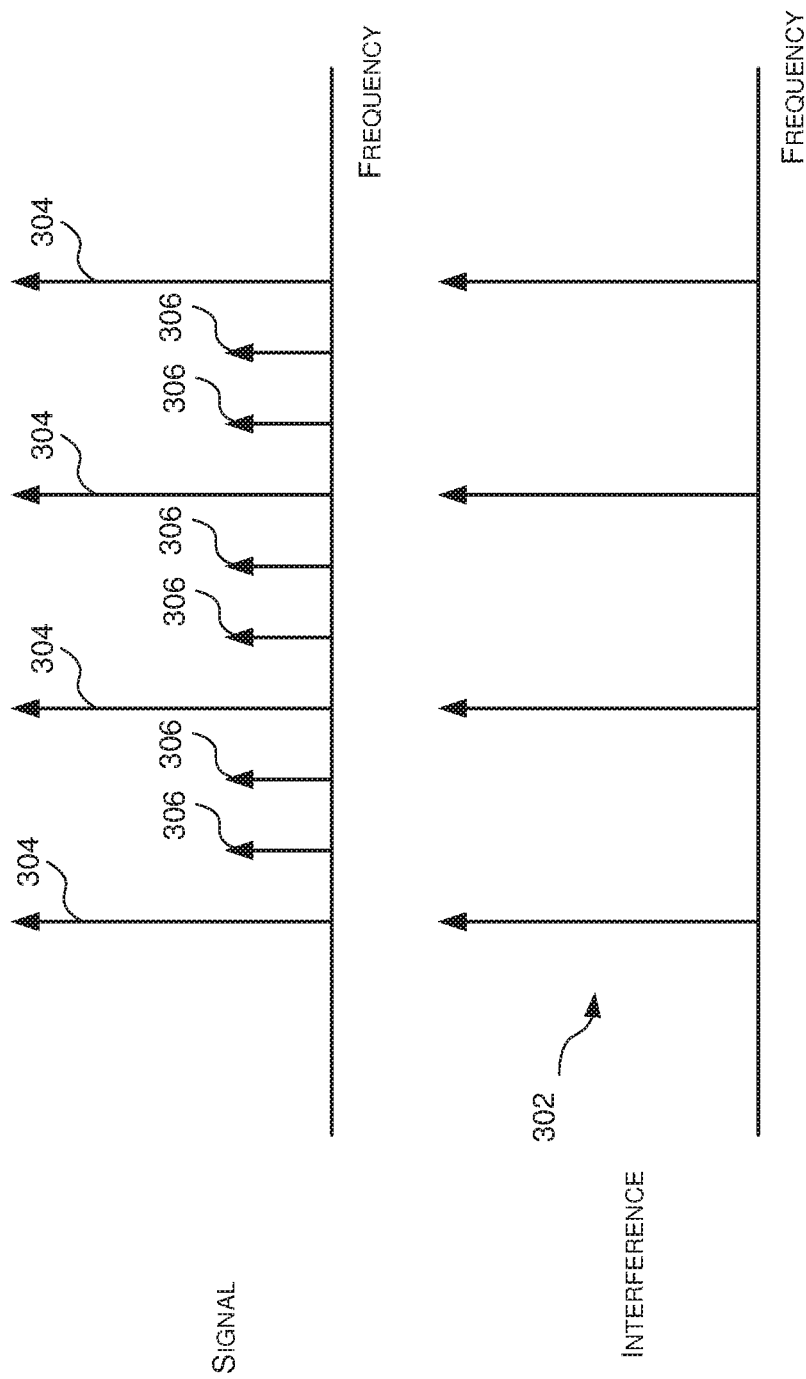
FIG. 3 is a schematic diagram illustrating a first example set of conditions which may result in the CSI not accurately reflecting the transmission conditions on the data cells.
Figure 4:
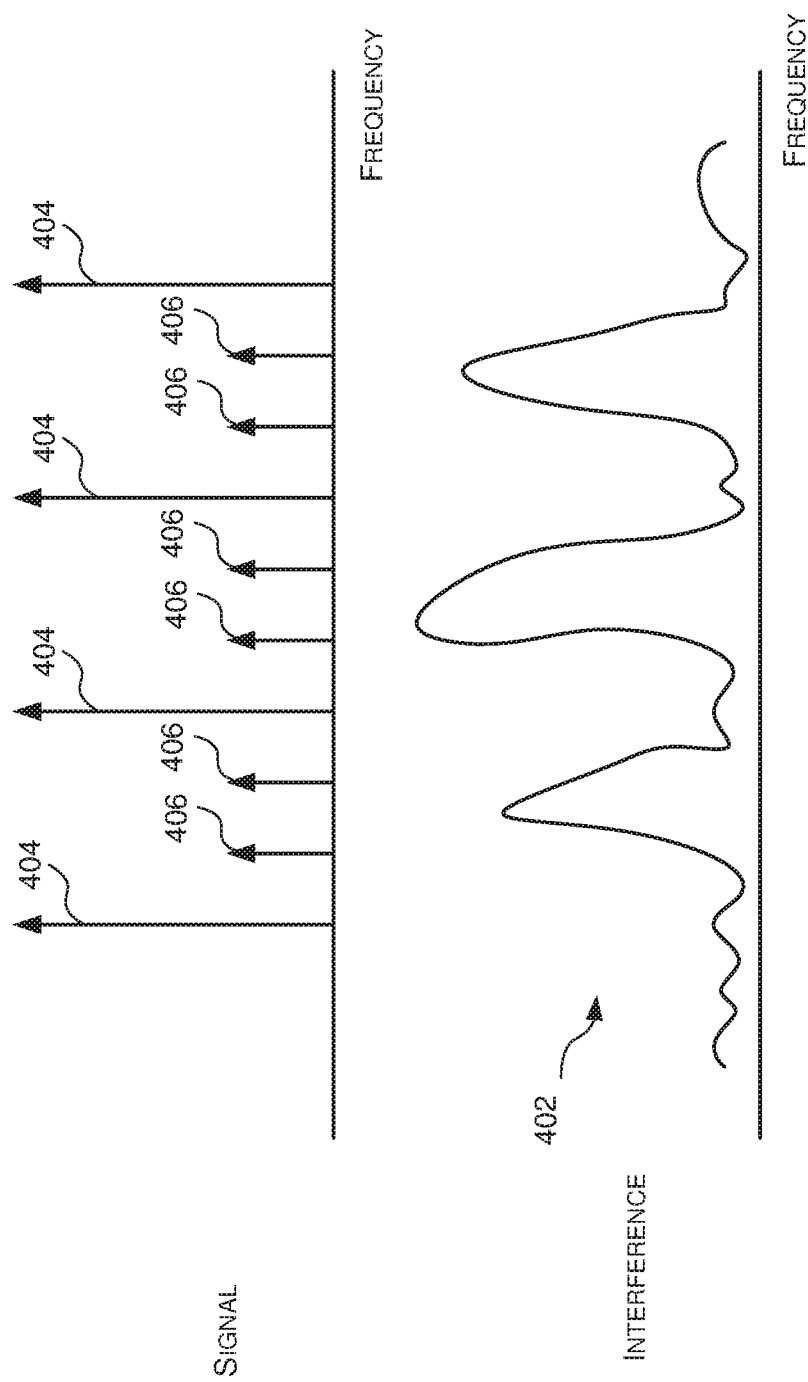
FIG. 4 is a schematic diagram illustrating a second example set of conditions which may result in the CSI not accurately reflecting the transmission conditions on the data cells.

For example, as shown in FIG. 3, there may be interference 302 that affects the pilot cells 304, but does not affect the data cells 306, which results in low CSI values being used to decode the data symbols which do not accurately reflect the 'good' channel conditions on the data cells. Similarly, as shown in FIG. 4, there may be interference 402 that affects all or some of the data cells 406 but does not affect pilot cells 404 resulting in CSI values being used to decode the data symbols which do not accurately reflect the 'poor' channel conditions on the data cells. In will be evident to a person of skill in the art that these are examples only and that there may be other transmission conditions in which the default scaling factors are not appropriate.

Accordingly, described herein are methods and CSI scaling modules for automatically adjusting the CSI scaling factor as a function of the performance of the soft decision error corrector. Specifically, in the methods, systems and apparatus described herein the performance of the soft decision error corrector is monitored and if it is detected that the performance falls below a predetermined acceptable level a new CSI scaling factor is selected. By monitoring the performance of the soft decision error corrector, situations in which the default CSI scaling factor is not appropriate can be detected and the CSI scaling factor adjusted accordingly. In some cases, a new CSI scaling factor is selected by sequentially applying a plurality of potential CSI scaling factors to live CSI values (i.e. the CSI values generated by the CSI calculator) to generate scaled CSI values, recording the performance of the soft decision error corrector when the scaled CSI values associated with each potential CSI scaling factor are used by the soft decision error corrector to decode the data stream, and selecting the potential CSI scaling factor that produced the best performance as the new CSI scaling factor.

Although example methods and CSI scaling modules for automatically adjusting the CSI scaling factor as a function of the performance of the soft decision error corrector are described below for COFDM signals and systems, it will be evident to a person of skill in the art that the methods, modules and techniques described herein are not limited to use in COFDM demodulators or in systems that transmit data over a transmission channel via COFDM and may be used in any transmission system or demodulator that comprises a soft decision error corrector that decodes data symbols based on CSI values related thereto.

Figure 5:
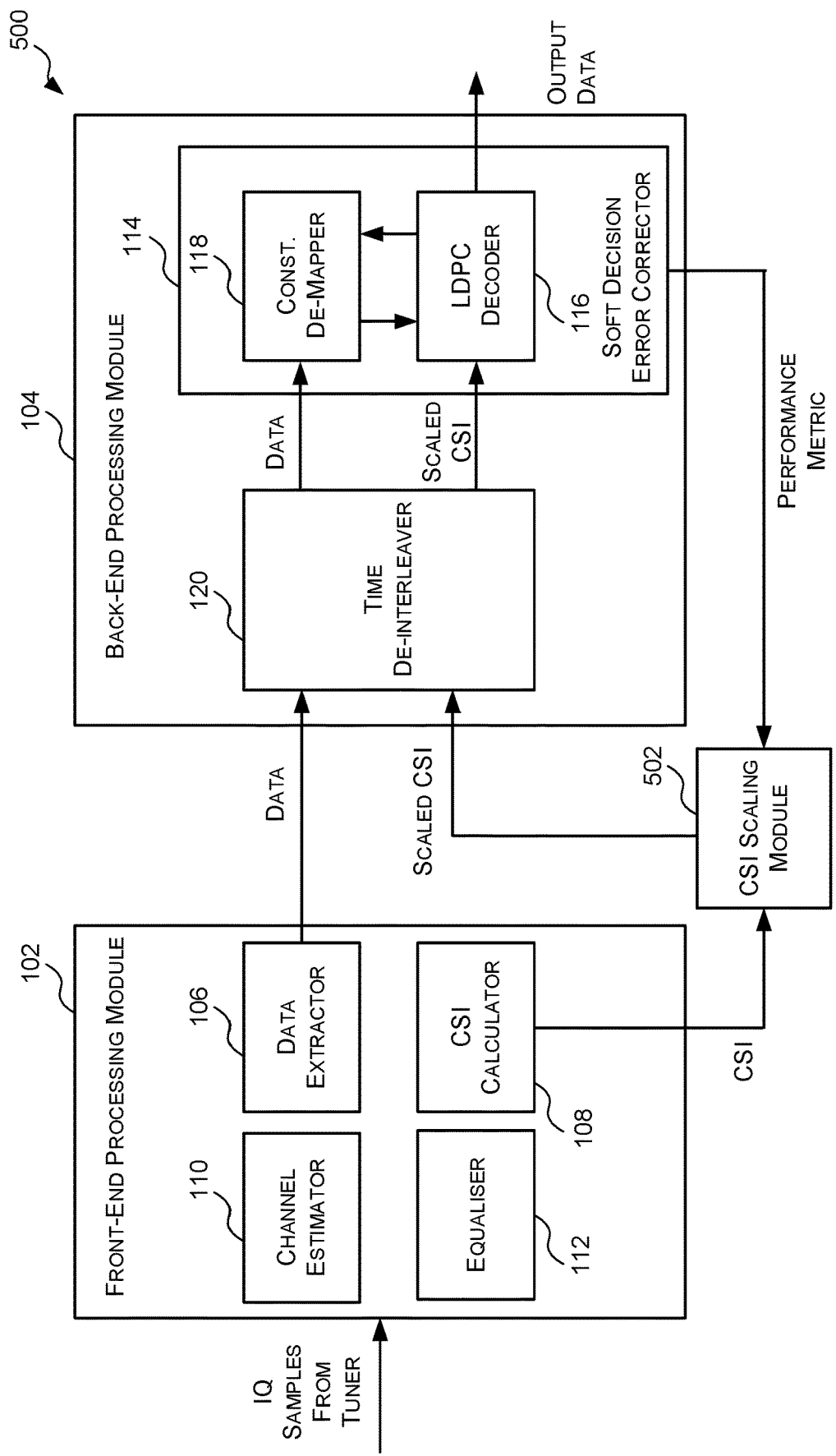
FIG. 5 is a block diagram of an example COFDM demodulator comprising a CSI scaling module.

Reference is now made to FIG. 5 which illustrates an example COFDM demodulator 500 in which the CSI scaling factor is automatically adjusted based on the performance of the soft decision error corrector 114. The demodulator 500 of FIG. 5 is the same as the demodulator 100 of FIG. 1 except it additionally comprises a CSI scaling module 502 situated between the CSI calculator 108 and the soft decision error corrector 114. The CSI scaling module 502 receives the CSI values generated by the CSI calculator 108 and performance metrics which indicate the performance of the soft decision error corrector 114 in decoding the data carried by the data symbols; adjusts the CSI scaling factor based on the performance metrics; and generates scaled CSI values based on the adjusted CSI scaling factor which are provided to the soft decision error corrector for use in decoding the received data. In the example of FIG. 5 the scaled CSI values are provided to the soft decision error corrector 114 via the time de-interleaver 120. However, in other systems that do not support time-interleaving, the scaled CSI values may be provided directly to the soft decision error corrector 114.

Where the soft decision error corrector comprises an LDPC decoder the performance metrics may include the number of iterations taken for the LDPC decoder to fully correct the errors on the data. It will be evident to a person of skill in the art that this is an example performance metric only and that other performance metrics may be used.

Figure 6:
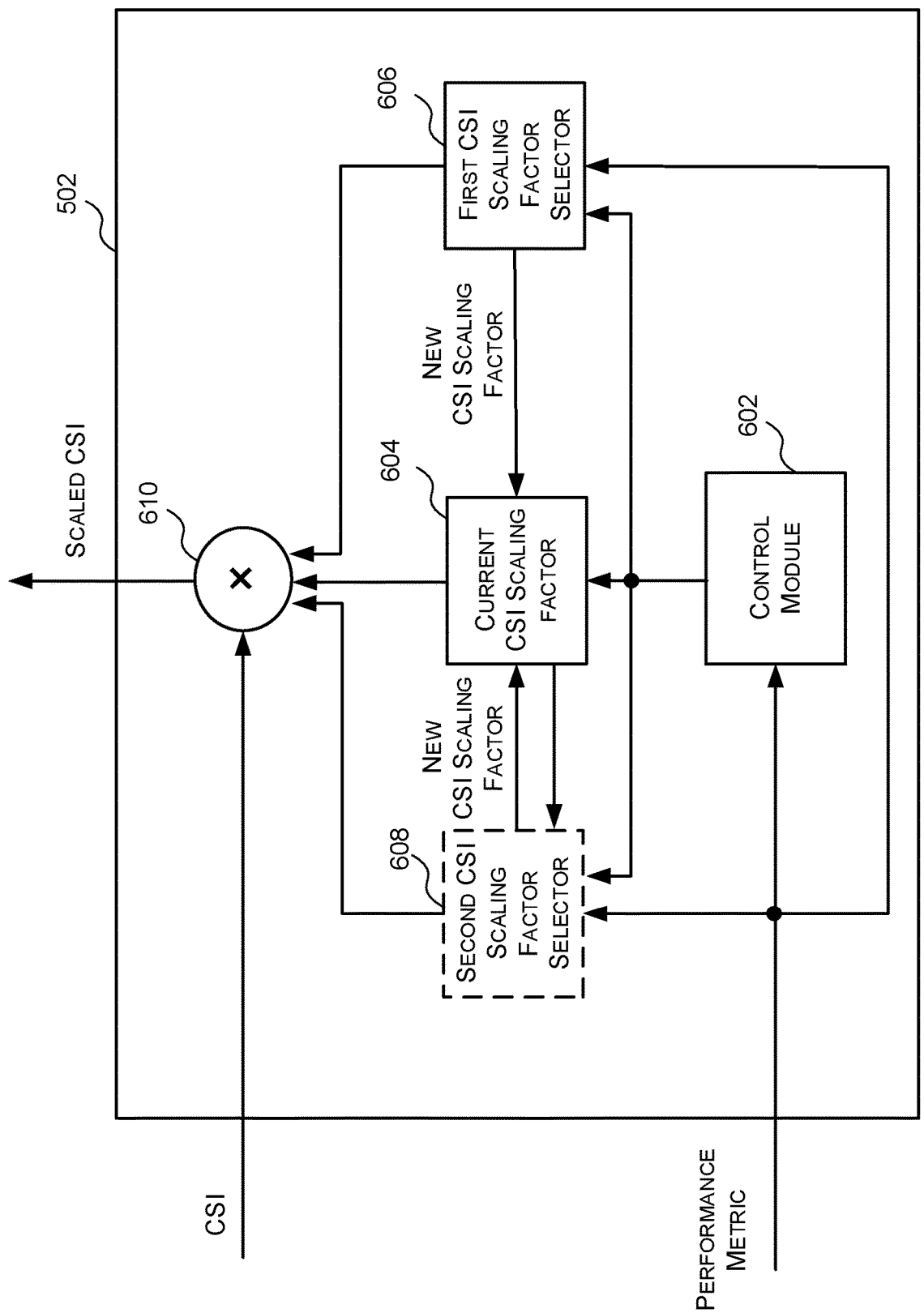
FIG. 6 is a block diagram of an example CSI scaling module of FIG. 5.

Reference is now made to FIG. 6 which illustrates an example CSI scaling module 502. The example CSI scaling module 502 of FIG. 6 can operate in one of two modes—a scaling mode in which the CSI scaling module 502 applies a current CSI scaling factor to the CSI values to generate scaled CSI values, and a reconfiguration mode in which the CSI scaling module identifies a new CSI scaling factor to be applied to the CSI values based on the performance metrics. During the reconfiguration mode test or potential CSI scaling values are applied to the CSI values. In some cases, the CSI scaling module 502 may determine which mode to operate in based on the performance metrics.

The example CSI scaling module 502 of FIG. 6 comprises a control module 602, a memory unit 604 for storing the current CSI scaling factor, at least one CSI scaling factor selector 606, 608 for selecting a new CSI scaling factor, and a scaling module 610 configured to apply a CSI scaling factor to the CSI values generated by the CSI calculator.

The control module 602 is configured to monitor the performance metrics and determine which mode to operate in based on the performance metrics. In some cases, the control module 602 may be configured to cause the CSI scaling module 502 to operate in the scaling mode unless the performance metrics indicate that the performance of the soft decision error corrector has fallen below a predetermined acceptable level. The control module 602 may cause the CSI scaling module 502 to operate in the scaling mode by causing the memory unit 604 storing the current CSI scaling factor to provide the current scaling factor to the scaling module (e.g. multiplier) 610. Once the control module 602 has detected that the performance metrics indicate that the performance of the soft decision error corrector has fallen below a predetermined acceptable level the control module 602 may cause the CSI scaling module 502 to operate in the reconfiguration mode. The control module 602 may cause the CSI scaling module 502 to operate in the reconfiguration mode by activating one of the one or more CSI scaling factor selectors 606, 608. In some cases, the control module 602 may activate a CSI scaling factor selector 606, 608 by sending a control signal to the CSI scaling factor selector 606, 608.

Accordingly, the control module 602 determines, from the performance metrics, whether the current CSI scaling factor accurately reflects the current transmission conditions or whether the current CSI scaling factor does not accurately reflect the current transmission conditions and can be adjusted to better reflect the current transmission conditions; and if the control module 602 determines that the current CSI scaling factor does not accurately reflect the current transmission conditions the control module 602 causes a new CSI scaling factor to be selected. The control module 602 may determine that the performance of the soft decision error corrector 114 has fallen below a predetermined level by comparing the performance metrics to a predetermined threshold. For example, where the performance metric is the number of LDPC iterations then the CSI scaling module 502 may be configured to determine that the performance of the soft decision error corrector 114 is below a predetermined level when the average number of LDPC iterations exceeds a predetermined threshold.

When the CSI scaling module 502 is operating in the scaling mode the current CSI scaling factor stored in the memory unit 604 is provided to the scaling module 610 and used to generated scaled CSI values from the CSI values received from the CSI calculator. In the example of FIG. 6 the scaling module 610 is a multiplier, but it will be evident to a person of skill in the art that this is an example only and that the scaling module 610 may generate the scaled CSI values in another manner. In contrast, when the CSI scaling module 502 is operating in the reconfiguration mode a CSI scaling factor selector 606, 608 selects or identifies a new CSI scaling factor that better reflects the current transmission conditions by providing a plurality of test CSI scaling factors (which may be referred to as the potential CSI scaling factors) to the scaling module (e.g. multiplier) 610 and selecting one of the test CSI scaling factors based on the performance metrics associated with the test CSI scaling factors. Once a CSI scaling factor selector 606, 608 has selected a new CSI scaling factor the new CSI scaling factor is stored in the memory unit 604 and the CSI scaling module 502 exits the reconfiguration mode and returns to the scaling mode.

One of the CSI scaling factor selectors 606 may be configured to select a new CSI scaling factor by sequentially applying each of a plurality of wide-spaced predetermined potential CSI scaling factors (e.g. spaced by at least 0.5 dB) to the CSI values, recording the performance metrics associated with each potential CSI scaling factor, and selecting the potential CSI scaling factor with the best performance metrics as the new CSI scaling factor. Alternatively, or in addition, one of the CSI scaling factor selectors 608 may be configured to select a new CSI scaling factor by generating a first potential CSI scaling factor by increasing the current CSI scaling factor by a predetermined amount, generating a second potential CSI scaling factor by decreasing the current CSI scaling factor by the predetermined amount, applying each of the first and second potential CSI scaling factors to the CSI values, recording the performance metrics associated with the first and second potential scaling factors, and selecting the potential CSI scaling factor with the best performance metrics as the new CSI scaling factor. Example methods for selecting a new CSI scaling factor which may be implemented by the CSI scaling factor selectors 606, 608 are described below with respect to FIGS. 8 to 12.

In some cases, the CSI scaling module 502 may comprise a plurality of CSI scaling factor selectors 606, 608 which are each configured to select a new CSI scaling factor using a different technique or method. In these cases, the control module 602 may be configured to, in response to determining that the CSI scaling module 502 is to operate in the reconfiguration mode, select one of the CSI scaling factor selectors 606, 608 to activate based on the performance metrics. For example, the CSI scaling factor selection method or technique implemented by one of the CSI scaling factor selector 606 may be more suitable for use when the current CSI scaling factor is far from the optimum CSI scaling factor and the CSI scaling factor selection method or technique implemented by another CSI scaling factor selector 608 may be more suitable for use when the current scaling factor is close to the optimum CSI scaling factor. In these cases, the control module 602 may be configured to select and active a CSI scaling factor selector 606, 608 that implements a CSI scaling factor selection method or technique that is suitable for use when the current CSI scaling factor is far from the optimum CSI scaling factor when the performance metrics indicate that the current CSI scaling factor is far from the current CSI scaling factor, and select and activate a CSI scaling factor selector that implements a CSI scaling factor selection technique that is suitable for use when the current CSI scaling factor is close to the optimum CSI scaling factor when the performance metrics indicate that the current CSI scaling factor is close to the current CSI scaling factor. An example method for selecting between multiple CSI scaling factor selectors is described below with reference to FIG. 13.

Figure 7:
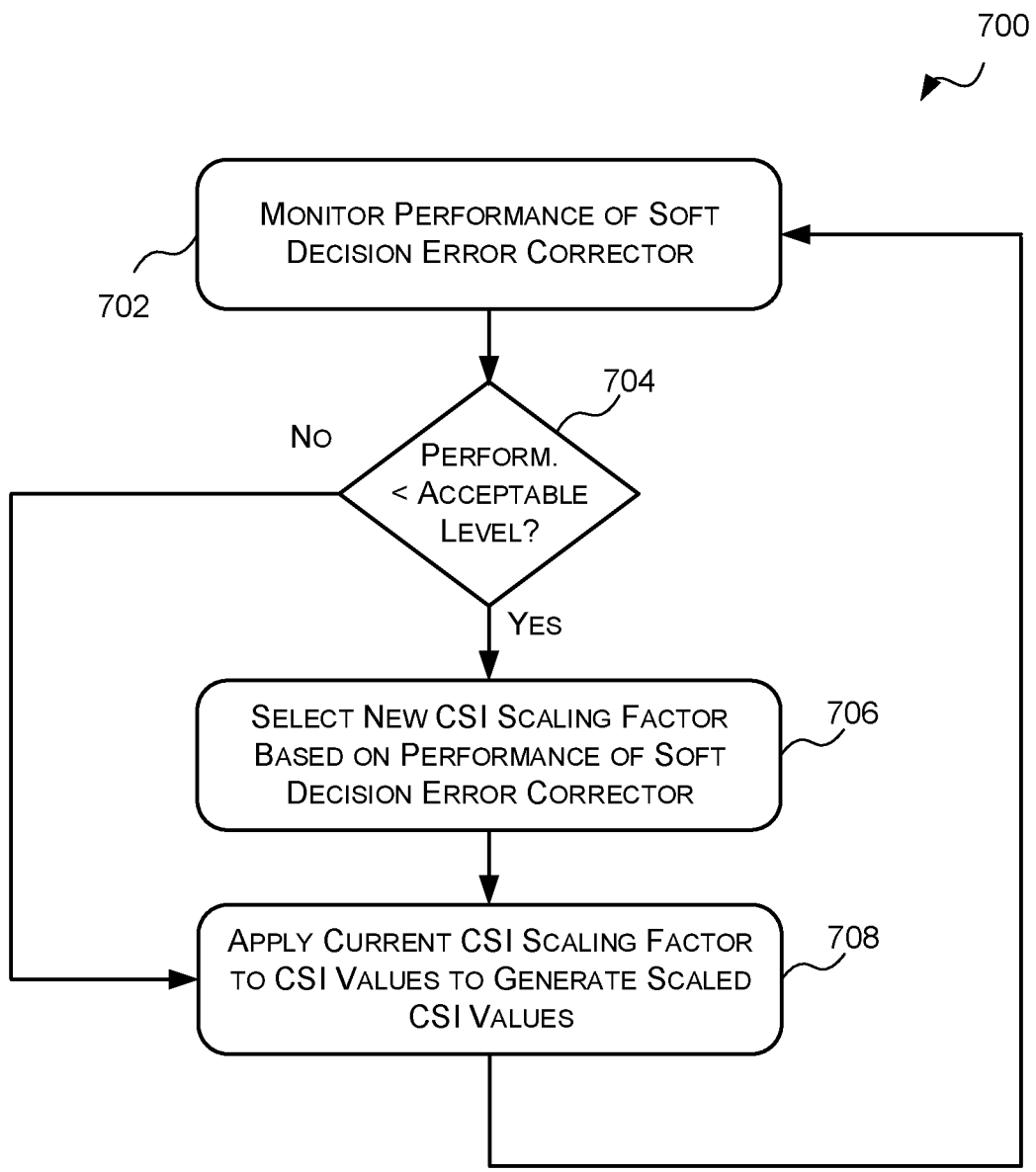
FIG. 7 is an example method for automatically adjusting the CSI scaling factor.

Reference is now made to FIG. 7 which illustrates a first example method 700 for automatically adjusting the CSI scaling factor applied to CSI values which may be implemented by the CSI scaling module 502 of FIG. 6. The method 700 begins at block 702 where the CSI scaling module 502 (e.g. control module) monitors the performance of the soft decision error corrector 114 of the COFDM demodulator. Monitoring the performance of the soft decision error corrector may comprise monitoring the performance metrics (e.g. LDPC iterations) output by the soft decision error corrector 114. At block 704 the CSI scaling module 502 (e.g. control module 602) determines whether the performance of the soft decision error corrector 114 has fallen below a predetermined acceptable level. The CSI scaling module 502 may determine that the performance of the soft decision error corrector 114 has fallen below a predetermined acceptable level by comparing the performance metrics to a threshold. For example, the CSI scaling module 502 may determine that the performance of the soft decision error corrector 114 has fallen below a predetermined acceptable level if the average number of LDPC iterations are higher than a predetermined threshold.

If the performance has dropped below an acceptable level than it is possible that the CSI values do not accurately reflect the channel conditions and so the method 700 proceeds to block 706 where a new or updated CSI scaling factor is determined based on the performance of the soft decision error corrector 114. Methods for determining a new or updated CSI scaling factor based on the performance of the soft decision error corrector 114 are described below with reference to FIGS. 8 and 11. If, however, the performance has not dropped below an acceptable level then likely the CSI values provided to the soft decision error corrector accurately reflect the current channel conditions and so the method 700 proceeds directly to block 708 where the current CSI scaling factor is used to generate scaled CSI values. The method 700 then proceeds back to block 702 where the CSI scaling module monitors the performance of the soft decision error corrector 114. In some cases, the CSI scaling module 502 is configured to wait a predetermined amount of time (e.g. 100 ms) before monitoring the performance of the soft decision error corrector 114 again.

In some cases, the CSI scaling module 502 may be configured to only execute the method 700 of FIG. 7 after a warm-up period has expired. Specifically, in some cases the CSI scaling module 502 may be configured to wait a predetermined time (e.g. 1.5 seconds) after the demodulator starts up before implementing the method 700 of FIG. 7. This prevents the optimisation of the CSI scaling from interfering with the soft-decision decoding while the soft decision error corrector and other modules, such as, but not limited to parameter tracking or channel estimation modules, may still be adapting to the transmission conditions.

Figure 8:
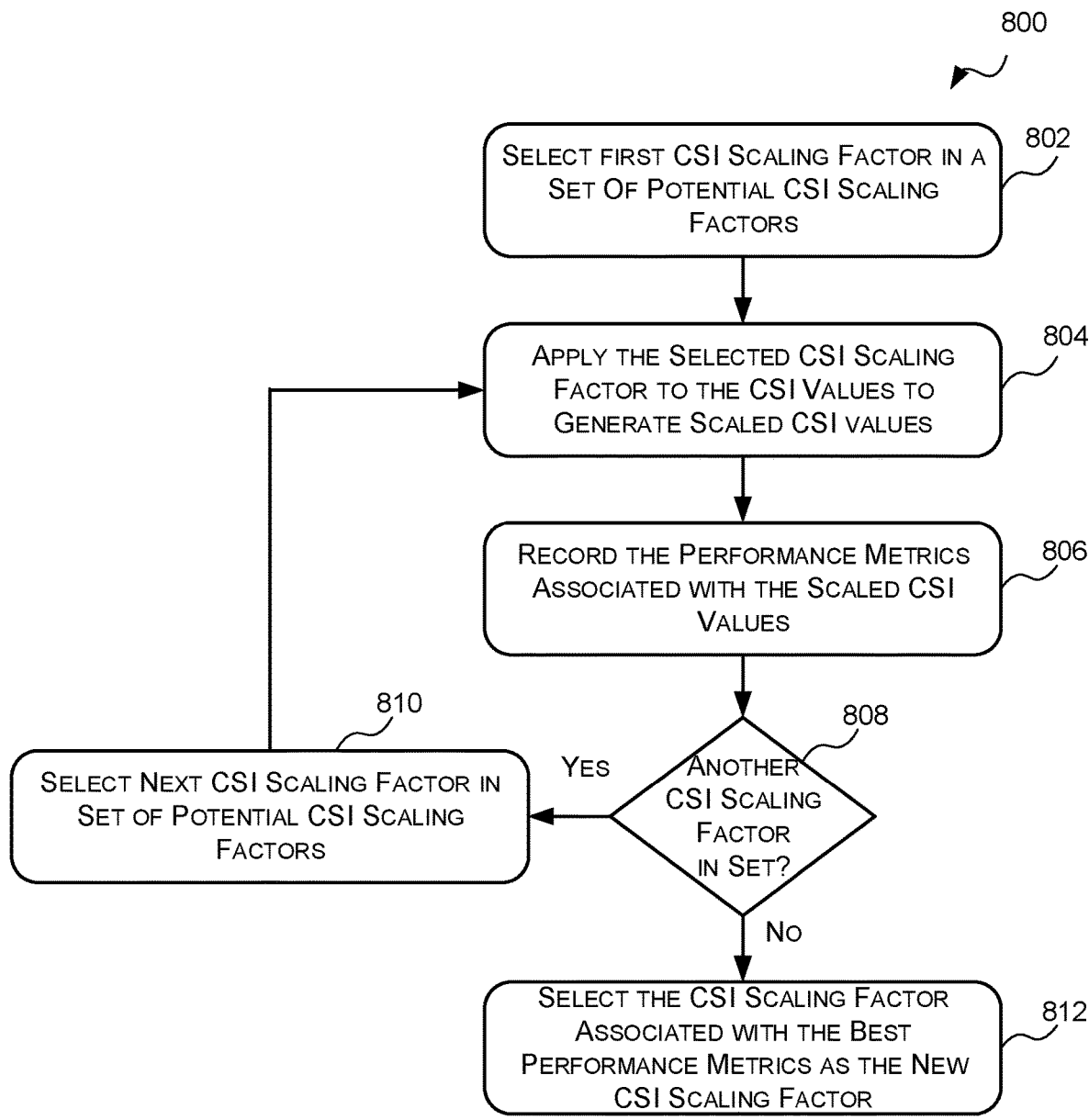
FIG. 8 is a flow diagram of a first example method of selecting a new CSI scaling factor.

Reference is now made to FIG. 8 which illustrates a first example method 800 for selecting a new CSI scaling factor based on the performance of the soft decision error corrector 114 which may be implemented by a CSI scaling factor selector 606. In this method 800 each of a plurality of wide-spaced potential scaling factors are sequentially applied to the CSI values. The performance metrics associated with each of the potential scaling factors are recorded and the potential CSI scaling factor that produced the best performance metrics is selected as the new CSI scaling factor. Since this method tests a plurality of potential CSI scaling factors over a wide range the method 800 of FIG. 8 may be referred to as the long range CSI scaling factor selection method.

The method 800 begins at block 802 where a first CSI scaling factor in a set of potential CSI scaling factors is selected. The set of potential CSI scaling factors comprises a plurality of wide-spaced CSI scaling factors (e.g. CSI scaling factors that are spaced by 0.5 dB) that cover a wide range. Once the first CSI scaling factor in the set has been selected the method 800 proceeds to block 804 where the selected CSI scaling factor is applied to a plurality of CSI values to generate a plurality of scaled CSI values. In some cases, the selected CSI scaling factor may be applied for a predetermined amount of time.

The performance metrics associated with the scaled CSI values (i.e. the performance metrics of the soft decision error corrector 114 when the scaled CSI values are used to decode the corresponding data) (or a representative thereof) are then recorded (block 806). In some cases, there may be a plurality of performance metrics associated with the scaled CSI values and only a single metric representing the plurality of metrics may be stored. For example, where the performance metric is the number of LDPC iterations the average or mean number of LDPC iterations for the scaled CSI values may be recorded.

Once the performance metrics have been recorded a determination is made (at block 808) whether there are any other potential CSI scaling factors in the set of potential CSI scaling factors. If there is at least one additional potential CSI scaling factor in the set, then the method 800 proceeds to block 810 where the next potential CSI scaling factor in the set is selected. The method 800 proceeds back to block 804 where the selected potential CSI scaling factor is applied to the CSI values to generate scaled CSI values, and the performance metrics related to those scaled CSI values are recorded. Once all of the CSI scaling factors have been selected, applied to a set of CSI values, and the performance metrics associated therewith recorded the method 800 proceeds to block 812 where the potential CSI scaling factor associated with the best performance metrics is selected as the new CSI scaling factor.

Figure 9:
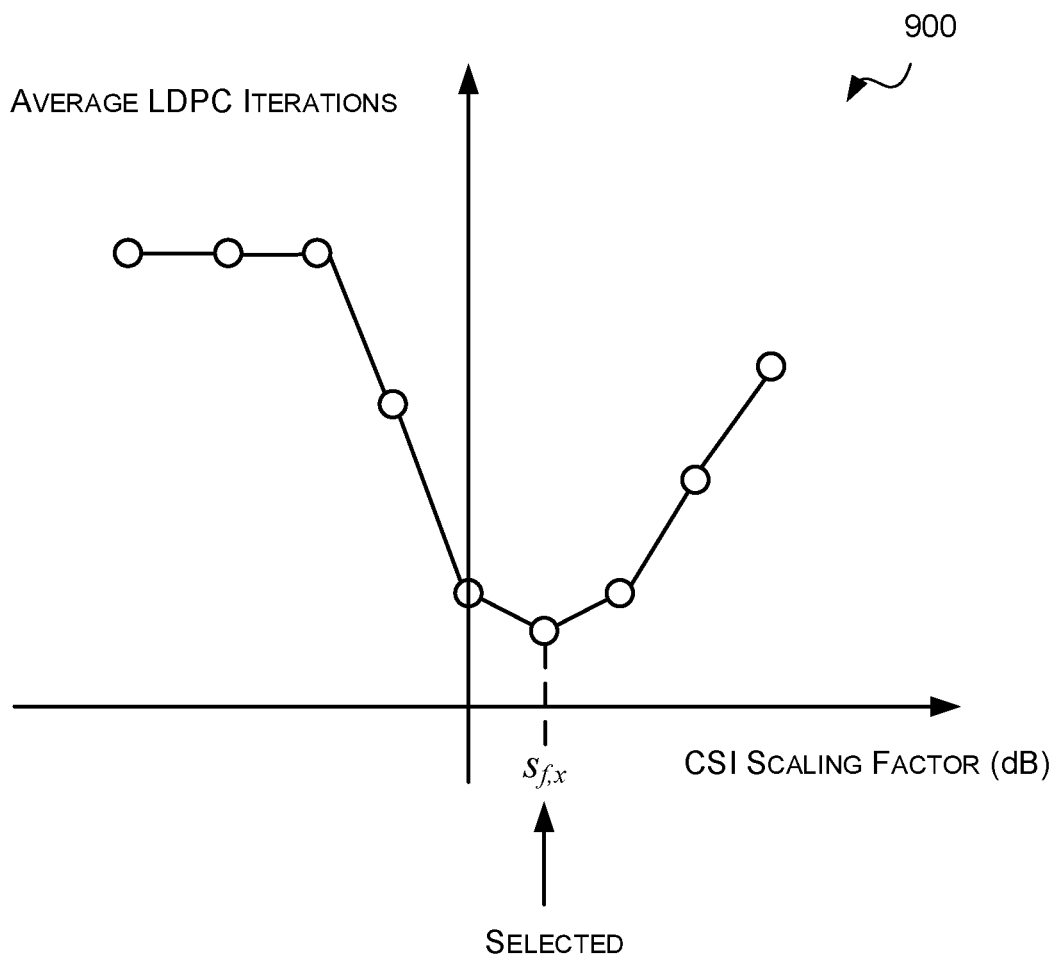
FIG. 9 is a graph illustrating an example of the method of FIG. 8.

An example of the implementation of the method 800 of FIG. 8 is illustrated in FIG. 9. In this example the performance metric is the number of LDPC iterations and the CSI scaling factor selector 606 is configured to apply a plurality of (e.g. nine) different CSI scaling factors to the CSI values to generate scaled CSI values, and record the average number of LDPC iterations associated with those scaled CSI values as shown in the graph 900 of FIG. 9. In this example, the CSI values scaled according to the $x^{th}$ potential CSI scaling factor $s_{f,x}$ produced the lowest average number of LDPC iterations thus the $x^{th}$ potential CSI scaling factor $s_{f,x}$ is selected as the new CSI scaling factor.

One of the advantages of the method 800 of FIG. 8 is that it is simple to implement. However, when the set of potential CSI scaling factors includes a large number of potential CSI scaling factors it may take a significant amount of time to select a new CSI scaling factor. Also, when the set of potential CSI scaling factors covers a large range of CSI scaling factors it is likely that at least one of the potential CSI scaling factors will be quite far from the optimum CSI scaling factor thus causing periods of poor performance while that potential CSI scaling factor is tested. Furthermore, since the potential CSI scaling factors are applied sequentially it is possible that different potential CSI scaling factors may be tested under different channel conditions thus the performance metrics may not only reflect the change in CSI scaling factor but may also reflect the change in channel conditions.

Figure 10:
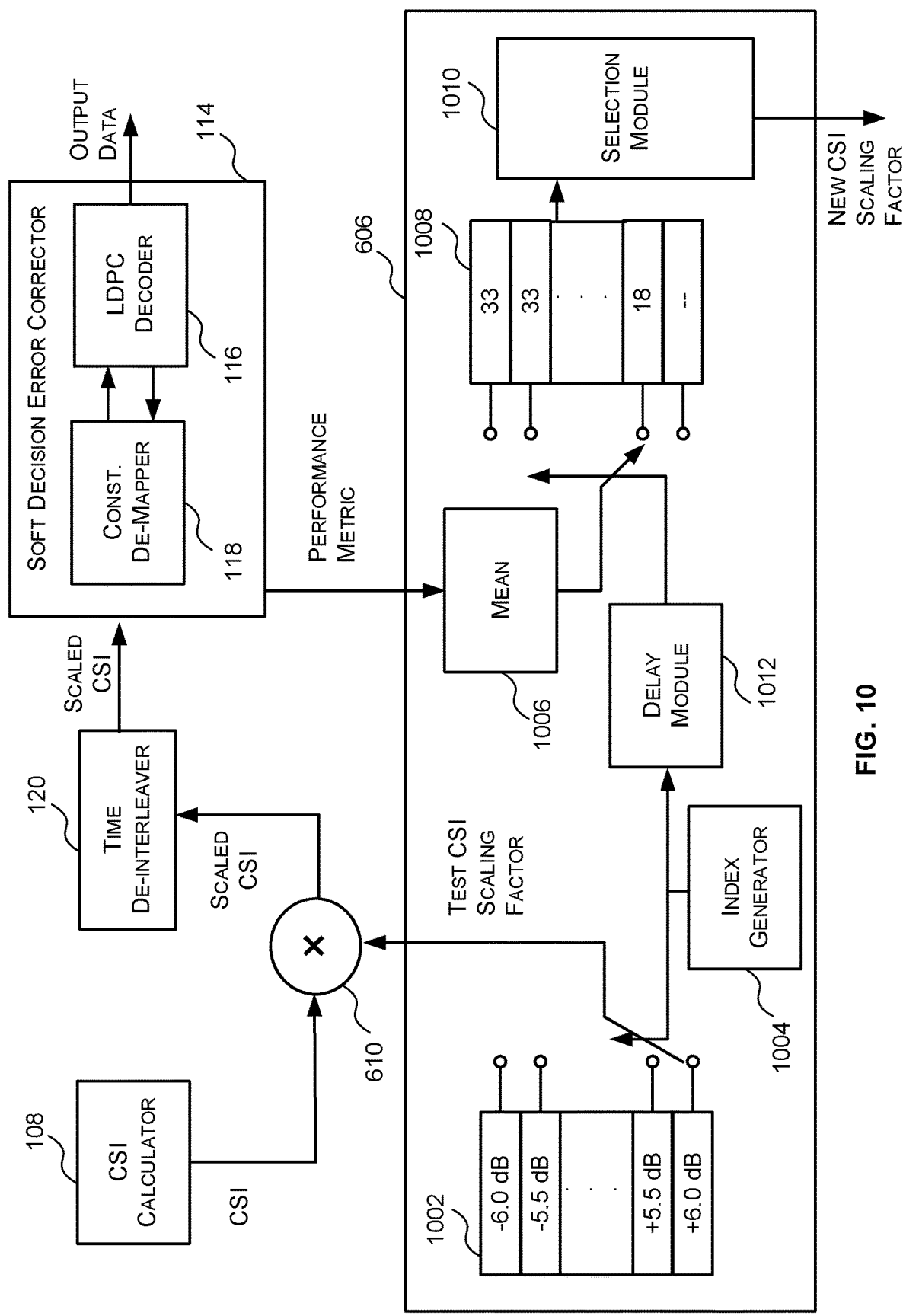
FIG. 10 is a block diagram of a first example CSI scaling factor selector.

Reference is now made to FIG. 10 which illustrates an example CSI scaling factor selector 606 configured to implement the method 800 of FIG. 8. The CSI scaling factor selector 606 comprises a first indexed table 1002 configured to store a plurality of potential CSI scaling factors; an index generator 1004 for generating indices to the first indexed table 1002 to cause the potential CSI scaling factors in the table to be provided to the scaling module (e.g. multiplier) 610 so as to generate scaled CSI values based on the potential CSI scaling factors; a mean module 1006 which is configured to calculate the mean or average of the performance metrics associated with each potential CSI scaling factor; a second indexed table 1008 for storing the mean values associated with each potential CSI scaling factor; and a selection module 1010 which is configured to select one of the potential CSI scaling factors as the next CSI scaling factor based on the values stored in the second indexed table 1008.

The first indexed table 1002 is configured to store a plurality of widely spaced potential CSI scaling factors that cover a wide range of scaling factors. The term "wide range of scaling factors" is intended to mean a sufficiently wide range of scaling factors so as to cover the relevant CSI scaling range during the test time, without causing the demodulator to restart during the test time due to poor performance. In the example shown in FIG. 10 the potential scaling factors are separated by 0.5 dB and cover the range −6.0 dB to +6.0 dB, but it will be evident to a person of skill in the art that the potential CSI scaling factors may be separated by other amounts, they may not be equally spaced (i.e. they may be separated by different amounts, and they may cover a different range.

The index generator 1004 is configured to sequentially generate indices to the first index table 1002 which causes the plurality of potential CSI scaling factors to be sequentially provided to the scaling module (e.g. multiplier) 610 so as to generate scaled CSI values based on each of the plurality of potential CSI scaling factors. For example, if the potential CSI scaling factors are indexed by indices 0 to 23 the index generator 1004 may be configured to sequentially output 0, 1, 2, . . . 23 which causes the potential CSI scaling factors associated with indices 0, 1, 2, . . . 23 to be sequentially provided to the scaling module (e.g. multiplier) 610 so as to generate one or more scaled CSI values based on each of the potential CSI scaling factors. The index generator 1004 is typically configured to output each index for a predetermined amount of time so that the potential CSI scaling factor associated with that index is applied to a plurality of CSI values.

The scaled CSI values are provided to the soft decision error corrector 114 for decoding the data extracted from the OFDM data signals. In some cases, where the system supports time de-interleaving, the scaled CSI values may be provided to the soft decision error corrector 114 via a time de-interleaver (TDI) 120. In other cases, the scaled CSI values may be provided directly to the soft decision error corrector 114. In addition to outputting the original data stream extracted from the OFDM data the soft decision error corrector 114 outputs a performance metric indicating the performance of the soft decision error corrector 114. As described above, where the soft decision error corrector comprises an LDPC decoder the performance metric may be a number of iterations consumed by the LDPC decoder to fully correct the errors in an FEC block. Typically, the higher the number of iterations, the poorer the performance. It will be evident to a person of skill in the art that this is an example only and that other performance metrics may be used.

The mean module 1006 is configured to generate a mean or average of the performance metrics that relate to each of the potential CSI scaling factors in the first indexed table 1002. The performance metrics that relate to a particular potential CSI scaling factor are those performance metrics that describe the performance of the soft decision error corrector 114 when the CSI values scaled in accordance with that particular potential CSI scaling factor were used to decode the OFDM symbol data. Accordingly, the mean module 1006 will generate a mean or average performance metric for the first potential CSI scaling factor in the first indexed table 1002, generate a mean or average performance metric for the second potential CSI scaling factor in the first indexed table 1002 and so on. As described above, in some cases the index generator 1004 is configured to apply each potential CSI scaling factor to a predetermined number X of CSI values or for a predetermined period of time T. In these cases, the mean module 1006 may be configured to calculate a new mean or average every X performance metrics or after time period T has elapsed. Although FIG. 10 illustrates a mean module 1006, other CSI scaling factor selectors may combine the performance metrics for each potential CSI scaling factor in another manner to generate a combined performance metric for each potential CSI scaling factor. For example, other CSI scaling factor selectors may be configured to generate a sum of the performance metrics, or a weighted sum of the performance metrics. For example, the weighting may be selected as a function of sudden changes to the transmission channel, such as sudden changes to the noise or channel impulse response.

The mean or average performance metric for each potential CSI scaling factor is stored in the second indexed table 1008 in a corresponding position. Specifically, if a first potential CSI scaling factor is stored in index position 0 of the first indexed table 1002 then the mean or average performance metric associated with that potential CSI scaling factor will be stored in index position 0 of the second indexed table 1008. This may be achieved by using the the same indices output by the index generator 1004 to control where the mean or average performance metrics are stored in the second indexed table 1008. Specifically, the index output by the index generator 1004 which causes the potential CSI scaling factor at index position k to be applied to a set of CSI values will cause the mean or average of the performance metrics associated with those CSI values (and thus with that CSI scaling factor) to be stored at index location k of the second indexed table 1008.

In some cases, there will be a delay between when a potential CSI scaling factor is applied to the CSI values and when the corresponding performance metrics are output by the soft decision error corrector 114. This will be particularly true if the COFDM system supports time interleaving. This is because if the COFDM system supports time interleaving the data and the corresponding CSI values will have to be passed through a time de-interleaver (TDI) 120, which, to de-interleave the data in a block, has to receive the entire block before contiguous deinterleaved data and CSI values can be output. In these cases, the indices output by the index generator 1004 may be passed through a delay module 1012 before they are used to control the writing of data to the second indexed table 1008.

The selection module 1010 is configured to select one of the potential CSI scaling factors as the new CSI scaling factor based on the mean or average performance metrics stored in the second indexed table 1008. In some cases, the selection module 1010 may be configured to select the potential CSI scaling factor which produced the best performance metric. Where the performance metric is the number of LDPC iterations then the best performance metric may be the lowest mean or average number of LDPC iterations. The selection module 1010 may be configured to identify the index position of the second indexed table 1008 with the best average or mean performance metric and select the potential CSI scaling factor from the first indexed table 1002 at that index position as the new CSI scaling factor. The new CSI scaling factor may then be stored in the memory unit 604 as the current CSI scaling factor.

Figure 11:
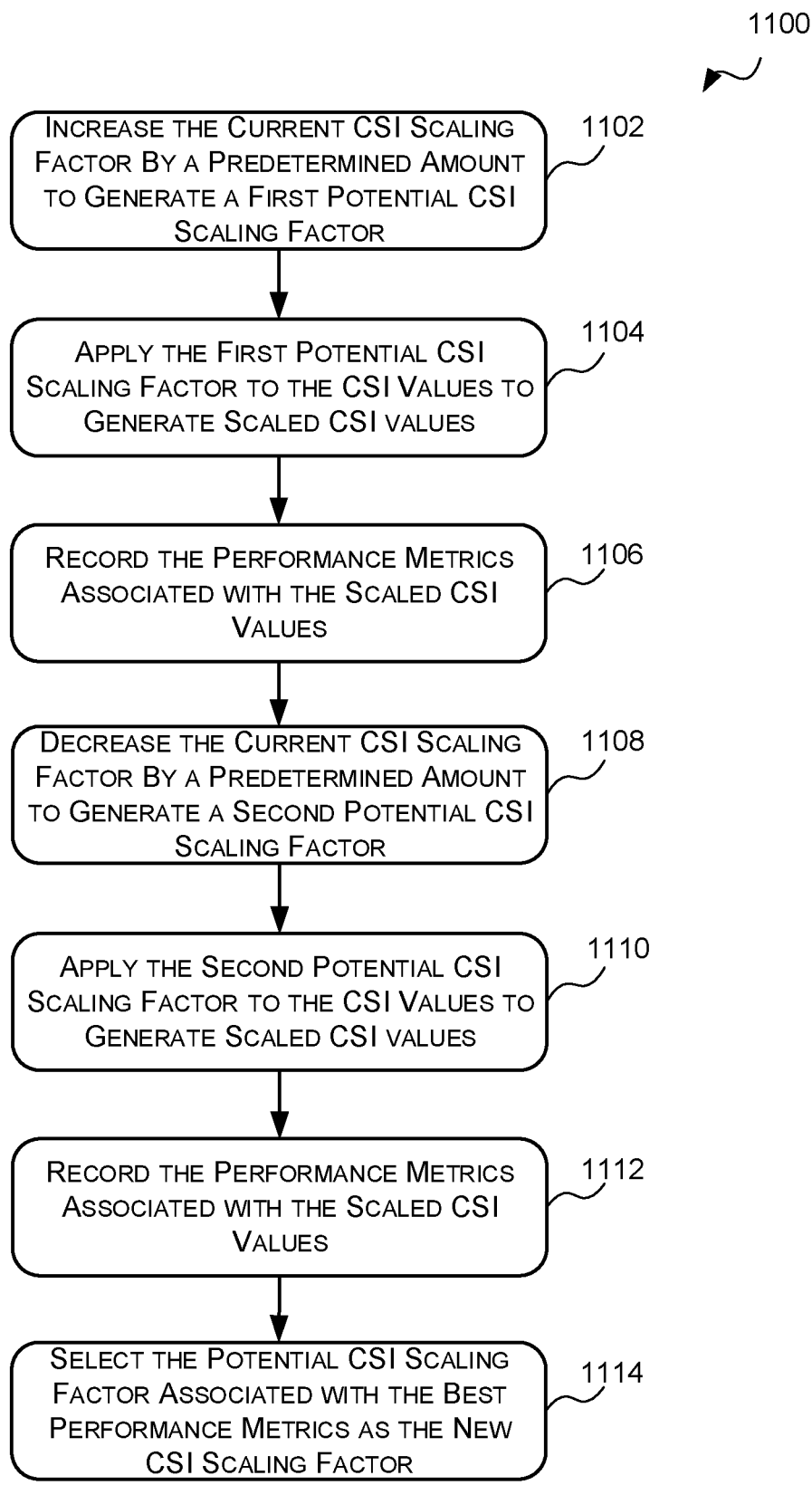
FIG. 11 is a flow diagram of a second example method of selecting a new CSI scaling factor.

Reference is now made to FIG. 11 which illustrates a second example method 1100 for selecting a new CSI scaling factor which may be implemented by a CSI scaling factor selector 608 of the CSI scaling module 502 of FIG. 6. In this example method 1100 the current CSI scaling factor is used to generate potential CSI scaling factors for testing. Specifically, a few (e.g. two) potential CSI scaling factors are generated that are close to the current CSI scaling factor. In the example method 1100 of FIG. 11 two potential CSI scaling factors are generated from the current CSI scaling factor—one that is above or greater than the current CSI scaling factor and one that is below or less than the current CSI scaling factor—however in other examples another number of potential CSI scaling factors may be generated from the current CSI scaling factor. Since the method 1100 of FIG. 11 tests only a few potential CSI scaling factors that are close to the current CSI scaling factor this method may be referred to as the short range method.

The method 1100 begins at block 1102 where a first potential CSI scaling factor is generated by increasing the current CSI scaling factor by a predetermined amount. In some cases, the first potential CSI scaling factor may be generated by multiplying the current CSI scaling factor by an increase factor (e.g. +0.1 dB). Once the first potential CSI scaling factor has been generated the method 1100 proceeds to block 1104 where the first potential CSI scaling factor is applied to a plurality of CSI values (e.g. CSI values generated by the CSI calculator) to generate a plurality of scaled CSI values. The performance metrics associated with the scaled CSI values (i.e. the performance metrics of the soft decision error corrector 114 when the scaled CSI values are used to decode data) (or a representative thereof) are then recorded (block 1106). In some cases, there may be a plurality of performance metrics and a single metric (e.g. average, mean, sum) representing the plurality of performance metrics may be stored. For example, where the performance metric is the number of LDPC iterations the average or mean number of LDPC iterations for the scaled CSI values may be recorded. Once the performance metrics have been recorded the method 1100 proceeds to block 1108.

At block 1108 a second potential CSI scaling factor is generated by decreasing the current CSI scaling factor by a predetermined amount. In some cases, the second potential CSI scaling factor may be generated by multiplying the current CSI scaling factor by a decrease factor (e.g. −0.1 dB). Once the second potential CSI scaling factor has been generated the method 1100 proceeds to block 1110 where the second potential CSI scaling factor is applied to a plurality of CSI values to generate a plurality of scaled CSI values. The performance metrics associated with the scaled CSI values (i.e. the performance metrics of the soft decision error corrector 114 when the scaled CSI values are used to decode data) (or a representative thereof) are then recorded (block 1112). In some cases, there may be a plurality of performance metrics and a single metric (e.g. average, mean, sum) representing the plurality of performance metrics may be stored. For example, where the performance metric is the number of LDPC iterations the average or mean number of LDPC iterations for the scaled CSI values may be recorded. Once the performance metrics have been recorded the method 1100 proceeds to block 1114.

At block 1114, one of the first and second potential CSI scaling factors is selected as the new CSI scaling factor based on the recorded performance metrics. Typically, the potential CSI scaling factor associated with the best performance metrics is selected as the new CSI scaling factor. What indicates the 'best' performance metric may depend on the specific performance metric used. For example, where the performance metric is the number of LDPC iterations the 'best' performance metric is the lowest number of LDPC iterations.

If the method 1100 of FIG. 11 is repeated the CSI scaling factor will slowly converge to an optimum CSI scaling factor.

One of the advantages of the method 1100 of FIG. 11 over the method 800 of FIG. 8 is the higher speed at which a new CSI scaling factor is selected. This is because a smaller number of potential CSI scaling factors are tested in the method 1100 of FIG. 11 than in the method 800 of FIG. 8. The method 1100 if FIG. 11 is also more likely to select the true optimum CSI scaling factor, particularly if the current CSI scaling factor is close to the optimum CSI scaling factor, compared to the method 800 of FIG. 8. This is because the potential CSI scaling factors are closer together. Furthermore, the method 1100 of FIG. 11 is less likely to cause significant performance degradation as the potential CSI scaling factors are close to the current CSI scaling factor. However, the method 1100 of FIG. 11 will cause some performance degradation as the method involves trying at least one potential CSI scaling factor that will be further away from the optimum CSI scaling factor. Also, if the channel conditions change too quickly the method 1100 of FIG. 11 may be unable to react in time and may get stuck on a poorly performing CSI scaling factor. However, these issues can be mitigated by initiating the method 1100 of FIG. 11 before the transmission conditions change too much.

Figure 12:
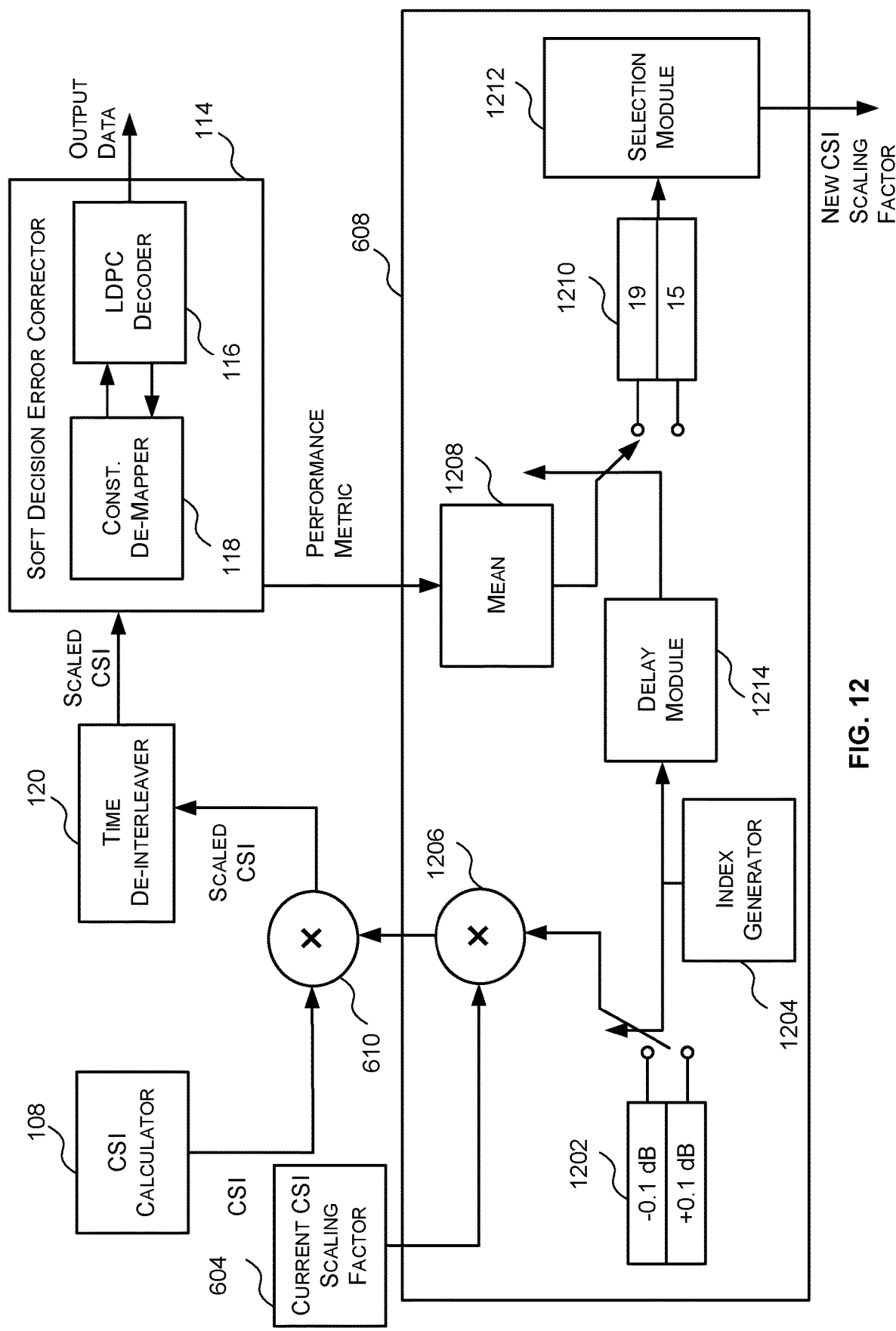
FIG. 12 is a block diagram of a second example CSI scaling factor selector.

Reference is now made to FIG. 12 which illustrates an example CSI scaling factor selector 608 configured to implement the method 1100 of FIG. 11. The CSI scaling factor selector 608 comprises a first indexed table 1202 comprising a plurality of adjustment factors; an index generator 1204 for generating indices to the first indexed table 1202 to cause the adjustment factors to be provided to a combination module 1206; a combination module 1206 which combines the received adjustment factors with the current CSI scaling factor to generate potential CSI scaling factors that are applied to the CSI values; a mean module 1208 which is configured to calculate the mean or average of the performance metrics associated with each potential CSI scaling factor; a second indexed table 1210 for storing the mean performance metrics associated with each potential CSI scaling factor; and a selection module 1212 which is configured to select the next CSI scaling factor based on the mean performance metrics stored in the second indexed table 1210.

The first indexed table 1202 is configured to store a small number of (e.g. two) adjustment factors that are to be applied to the current CSI scaling factor to generate potential CSI scaling factors that are 'close' to the current CSI scaling factor. The adjustment factors are typically relatively closely spaced. Adjustment factors are said to be closely spaced when switching from one to the other will cause a small, but notorious change to the system performance. The spacing of the adjustment factors may be a small fraction of the total relevant CSI scaling range. In some cases, the plurality of adjustment factors comprises at least one adjustment factor that will generate a potential CSI scaling factor that is greater than the current CSI scaling factor and at least one adjustment factor that will generate a potential CSI scaling factor that is less than the current CSI scaling factor. In the example shown in FIG. 12 the potential CSI scaling factors are −0.1 dB and +0.1 dB, but it will be evident to a person of skill in the art that these are only example adjustment factors and that other adjustment factors and/or another number of adjustment factors may be used.

The index generator 1204 is configured to sequentially generate indices to the first indexed table 1202 which causes the plurality of adjustment factors to be sequentially provided to the combiner (e.g. multiplier) 1206 which applies the adjustment factor to the current CSI scaling factor to generate a potential CSI scaling factor to be tested. For example, if the plurality of adjustment factors are indexed by indices 0 and 1 the index generator 1204 may be configured to first output an index of 0 which causes the adjustment factor at index 0 (e.g. −0.1 dB) to be provided to the combiner (e.g. multiplier) 1206 which applies the adjustment factor to the current CSI scaling factor to generate a first potential CSI scaling factor, and then output an index of 1 which causes the adjustment factor at index 1 (e.g. +0.1 dB) to be provided to the combiner (e.g. multiplier) 1206 which applies the adjustment factor to the current CSI scaling factor to generate a second potential CSI scaling factor. The potential CSI scaling factors are then provided to the scaling module (e.g. multiplier) 610 which applies the potential CSI scaling factors to the CSI values (e.g. the CSI values generated by the CSI calculator 108) to generate scaled CSI values. The index generator 1204 is typically configured to output each index for a predetermined amount of time so that the potential CSI scaling factor generated by the adjustment factor associated with that index is applied to a plurality of CSI values and these have an effect on the performance metric at the output of the system.

The scaled CSI values are provided to the soft decision error corrector 114 for decoding. In some cases, where the system supports time de-interleaving, the scaled CSI values may be provided to the soft decision error corrector 114 via a time de-interleaver (TDI) 120. In other cases, the scaled CSI values may be provided directly to the soft decision error corrector 114. In addition to outputting the original data stream extracted from the OFDM data the soft decision error corrector 114 outputs a performance metric indicating the performance of the soft decision error corrector 114. As described above, where the soft decision error corrector comprises an LDPC decoder the performance metric may be a number of iterations consumed by the LDPC decoder to fully correct the errors on the data. Typically, the higher the number of iterations, the poorer the performance. It will be evident to a person of skill in the art that this is an example only and that other performance metrics may be used.

The mean module 1208 generally works in the same manner as the mean module 1006 of FIG. 10. Specifically, the mean module 1208 is configured to generate a mean or average of the performance metrics that relate to each of the potential CSI scaling factors generated by the adjustment factors in the first indexed table. The performance metrics that relate to a particular potential CSI scaling factor are those performance metrics that describe the performance of the soft decision error corrector 114 when the CSI values scaled in accordance with that particular potential CSI scaling factor were used decode the OFDM symbol data. Accordingly, the mean module 1208 will generate a mean or average performance metric for the first potential CSI scaling factor generated from the first adjustment factor, generate a mean or average performance metric for the second potential CSI scaling factor generated from the second adjustment factor and so on. As described above, in some cases the index generator 1204 is configured to apply each adjustment factor to the current CSI scaling factor so that a predetermined number X of CSI values are scaled or for a predetermined amount of time T. In these cases, the mean module 1208 may be configured to calculate a new mean or average every X performance metrics or after the time period T has elapsed. Although FIG. 12 illustrates a mean module 1208, other CSI scaling factor selectors may combine the performance metrics for each potential CSI scaling factor in another manner to generate a combined performance metric for each potential CSI scaling factor. For example, other CSI scaling factor selectors may be configured to generate a sum of the performance metrics or a weighted sum of the performance metrics as described above.

The mean or average performance metric for each potential CSI scaling factor is stored in the second indexed table 1210 in a corresponding position. Specifically, if a first potential CSI scaling factor is generated from an adjustment factor stored in index position 0 of the first indexed table 1202 then the mean or average performance metric associated with that potential CSI scaling factor will be stored in index position 0 of the second indexed table 1210. This may be achieved by using the same indices output by the index generator 1204 to control where the mean or average performance metrics are stored in the second indexed table 1210. Specifically, the index output by the index generator 1204 which causes the adjustment factor at index position k to be applied to the current CSI scaling factor will cause the performance metrics associated with the scaled CSI values generated therefrom (and thus are associated with that potential CSI scaling factor) to be stored at index location k of the second indexed table 1210.

In some cases, there will be a delay between when a potential CSI scaling factor is applied to the CSI values and when the corresponding performance metrics are output by the soft decision error corrector 114. This will be particularly true if the COFDM system supports time interleaving. This is because if the COFDM system supports time interleaving the data and the corresponding CSI values will have to be passed through a time de-interleaver (TDI) 120 which to de-interleave the data in a block has to receive the entire block before contiguous deinterleaved data and CSI values can be output. In these cases, the indices output by the index generator 1204 may be passed through a delay module 1214 before they are used to control the writing of data to the second indexed table 1210.

The selection module 1212 is configured to work in a similar manner to the selection module 1010 of FIG. 10. Specifically, the selection module 1212 is configured to select one of the potential CSI scaling factors as the new CSI scaling factor based on the mean or average performance metrics stored in the second indexed table 1210. In some cases, the selection module 1212 may be configured to select the potential CSI scaling factor which produced the best performance metric. Where the performance metric is the number of LDPC iterations then the best performance metric may be the lowest mean or average number of LDPC iterations. The selection module 1212 may be configured to identify the index position of the second indexed table 1210 with the best average or mean performance metric and use the adjustment factor at the corresponding index in the first indexed table 1202 to generate the new CSI scaling factor from the current CSI scaling factor. The new CSI scaling factor may then be stored in the memory unit 604 as the current CSI scaling factor.

Figure 13:
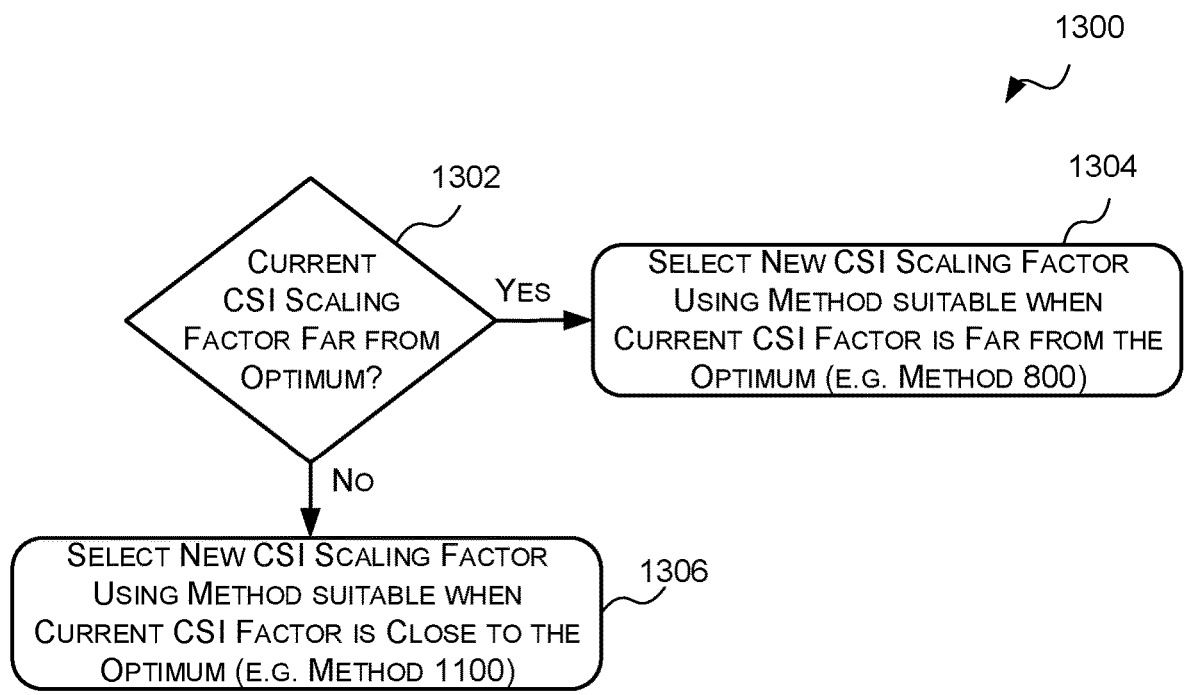
FIG. 13 is a flow diagram of an example method of selecting between a plurality of CSI scaling factor selection methods.

Reference is now made to FIG. 13 which illustrates an example method 1300 for selecting between two CSI scaling factor selection methods which may be implemented by the CSI scaling module (e.g. control module 602) wherein at least one method is suitable for selecting a new CSI scaling factor when the current CSI scaling factor is far from the optimum CSI scaling factor (e.g. method 800 of FIG. 8) and at least one method is suitable for selecting a new CSI scaling factor when the current CSI scaling factor is close to the optimum CSI scaling factor (e.g. method 1100 of FIG. 11). The method 1300 is typically implemented or executed after it has been determined that the CSI scaling factor is to be adjusted (e.g. after determining the performance of the soft decision error corrector has fallen below an acceptable level).

The method 1300 begins at block 1302 where the CSI scaling module (e.g. control module 602) determines whether the performance metrics indicate that the current CSI scaling factor is far from the optimum CSI scaling factor. In some cases, where the performance metric is the number of LDPC iterations, the CSI scaling module 502 may be configured to determine that the performance metrics indicate that the current CSI scaling factor is far from the optimum CSI scaling factor if the LDPC saturation time (i.e. the time the average number of LDPC iterations is the maximum number) is greater than a predetermined threshold (e.g. 1.5 seconds). If the performance metrics indicate that the current CSI scaling factor is far from the optimum CSI scaling factor, then the method 1300 proceeds to block 1304 where a method that is suitable for selecting a new CSI scaling factor when the current CSI scaling factor is far from the optimum CSI scaling factor (e.g. the method 800 of FIGS. 8) is used to select a new CSI scaling factor. If the performance metrics do not indicate that the current CSI scaling factor is far from the optimum CSI scaling factor, then the performance metrics are deemed to indicate that the current CSI scaling factor is close to the optimal CSI scaling factor and the method 1300 proceeds to block 1306 where a method that is suitable for selecting a new CSI scaling factor when the current CSI scaling factor is close to the optimum scaling factor (e.g. the method 1100 of FIG. 11) is used to select a new CSI scaling factor.

Although the CSI scaling modules and methods are described above as testing potential CSI scaling factors by applying them to live CSI values and using the scaled CSI values to decode the live data stream, in other examples the soft decision error corrector may be able to decode the same data stream using two different CSI values—one that is scaled using the current CSI scaling factor and one that is scaled using a test or potential CSI scaling factor. This would allow new CSI scaling factors to be tested without affecting the performance of the demodulator. In such cases a new CSI scaling factor may only be applied to the live data stream once it has been selected as the new CSI scaling factor.

The demodulators, calculation modules, CSI scaling modules and CSI scaling factor selectors of FIGS. 1, 2, 5, 6, 10 and 12 are shown as comprising a number of functional blocks. This is schematic only and is not intended to define a strict division between different logic elements of such entities. Each functional block may be provided in any suitable manner. It is to be understood that intermediate values described herein as being formed by a demodulator, calculation module, CSI scaling module or CSI scaling factor selector need not be physically generated by the demodulator, calculation module, CSI scaling module or CSI scaling factor selector at any point and may merely represent logical values which conveniently describe the processing performed by the demodulator, calculation module, CSI scaling module or CSI scaling factor selector between its input and output.

The CSI scaling modules and demodulators described herein may be embodied in hardware on an integrated circuit. The CSI scaling modules and demodulators described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a CSI scaling module or demodulator configured to perform any of the methods described herein, or to manufacture a CSI scaling module or demodulator comprising any apparatus described herein. An integrated circuit definition dataset may be, for example, an integrated circuit description.

Therefore, there may be provided a method of manufacturing, at an integrated circuit manufacturing system, a CSI scaling module or demodulator as described herein. Furthermore, there may be provided an integrated circuit definition dataset that, when processed in an integrated circuit manufacturing system, causes the method of manufacturing a CSI scaling module or demodulator to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a CSI scaling module or a demodulator will now be described with respect to FIG. 14.

Figure 14:
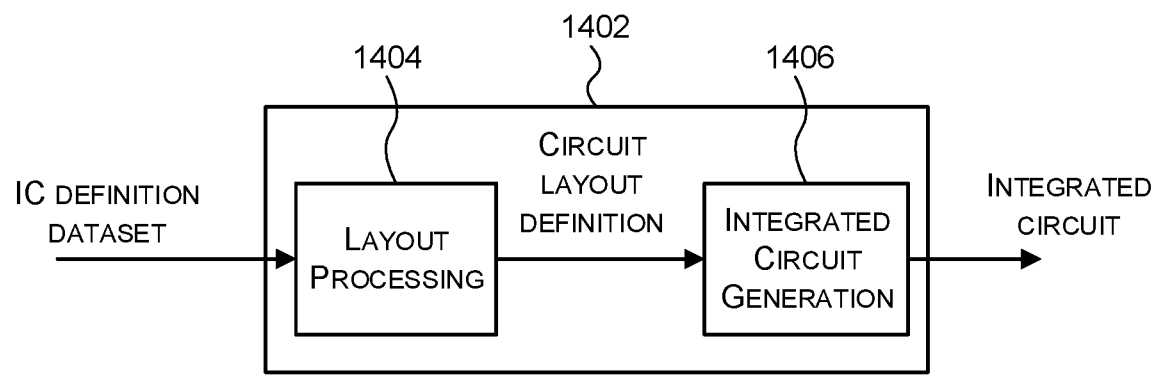
FIG. 14 is a block diagram of an example integrated circuit manufacturing system for generating an integrated circuit embodying the CSI scaling modules and demodulators described herein.

FIG. 14 shows an example of an integrated circuit (IC) manufacturing system 1402 which is configured to manufacture a CSI scaling module or demodulator as described in any of the examples herein. In particular, the IC manufacturing system 1402 comprises a layout processing system 1404 and an integrated circuit generation system 1406. The IC manufacturing system 1402 is configured to receive an IC definition dataset (e.g. defining a CSI scaling module or a demodulator as described in any of the examples herein), process the IC definition dataset, and generate an IC according to the IC definition dataset (e.g. which embodies a CSI scaling module, or a demodulator as described in any of the examples herein). The processing of the IC definition dataset configures the IC manufacturing system 1402 to manufacture an integrated circuit embodying a CSI scaling module or a demodulator as described in any of the examples herein.

The layout processing system 1404 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1404 has determined the circuit layout it may output a circuit layout definition to the IC generation system 1406. A circuit layout definition may be, for example, a circuit layout description.

The IC generation system 1406 generates an IC according to the circuit layout definition, as is known in the art. For example, the IC generation system 1406 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1406 may be in the form of computer-readable code which the IC generation system 1406 can use to form a suitable mask for use in generating an IC.

The different processes performed by the IC manufacturing system 1402 may be implemented all in one location, e.g. by one party. Alternatively, the IC manufacturing system 1402 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a CSI scaling module or a demodulator without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 14 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 14 the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A channel state information (CSI) scaling module for use in a demodulator configured to demodulate a signal received over a transmission channel, the CSI scaling module comprising:
 a scaling module configured to apply a current CSI scaling factor to CSI values associated with data symbols of the received signal to generate scaled CSI values and provide the scaled CSI values to a soft decision error corrector of the demodulator, the soft decision error corrector configured to decode data carried on the data symbols of the received signal based on the scaled CSI values;
 a control module configured to:
  monitor performance of the soft decision error corrector; and
  in response to determining that the performace of the soft decision error corrector is below a predetermined level, activate one of one or more CSI scaling factor selectors; and
 the one or more CSI scaling factor selectors, each CSI scaling factor selector configured to, in response to being activated, dynamically select a new CSI scaling factor based on the performance of the soft decision error corrector.

2. The CSI scaling module of claim 1, wherein at least one of the one or more CSI scaling factor selectors is configured to dynamically select a new CSI scaling factor by:
 sequentially providing a plurality of potential CSI scaling factors to the scaling module to generate at least one scaled CSI value for each potential CSI scaling factor;
 recording the performance of the soft decision error corrector for the at least one scaled CSI value for each potential CSI scaling factor; and
 selecting the potential CSI scaling factor associated with the best performance as the new CSI scaling factor.

3. The CSI scaling module of claim 2, wherein the plurality of potential CSI scaling factors comprises a plurality of widely spaced CSI scaling factors.

4. The CSI scaling module of claim 2, wherein the plurality of potential CSI scaling factors are stored in an indexed table.

5. The CSI scaling module of claim 2, wherein the plurality of potential CSI scaling factors comprises a plurality of closely spaced CSI scaling factors.

6. The CSI scaling module of claim 2, wherein the plurality of potential CSI scaling factors are generated by applying each of a plurality of adjustment factors to the current CSI scaling factor.

7. The CSI scaling module of claim 6, wherein the plurality of adjustment factors comprises an increase adjustment factor which is configured to generate a first potential CSI scaling factor that is larger than the current CSI scaling factor and a decrease adjustment factor which is configured to generate a second potential CSI scaling factor that is smaller than the current CSI scaling factor.

8. The CSI scaling module of claim 6, wherein the plurality of adjustment factors are stored in an indexed table.

9. The CSI scaling module of claim 1, wherein:
 the CSI scaling module comprises a plurality of CSI scaling factor selectors, each CSI scaling factor selector configured to, when activated, select a new CSI scaling factor based on the performance of the soft decision error corrector in a different manner; and
 the control module is further configured to, in response to determining that the performance of the soft decision error corrector is below the predetermined level:
  determine whether the performance of the soft decision error corrector indicates that the current CSI scaling factor is far from an optimum CSI scaling factor;
  in response to determining that the performance of the soft decision error corrector indicates that the current CSI scaling factor is far from the optimum CSI scaling factor, activating one of the plurality of CSI scaling factor selectors; and
  in response to determining that the performance of the soft decision error corrector does not indicate that the current CSI scaling factor is far from the optimum CSI scaling factor, activating a different one of the plurality of CSI scaling factor selectors.

10. The CSI scaling module of claim 1, wherein the soft decision error corrector comprises a low-density parity check (LDPC) decoder and the performance of the soft decision error corrector is based on a number of LDPC iterations to remove errors in a forward error correction block.

11. The CSI scaling module of claim 1, wherein the performance of the soft decision error corrector is based on a performance metric generated by the soft decision error corrector.

12. The CSI scaling module of claim 1, wherein the control module is configured to, in response to determining that the performance of the soft decision error corrector is not below the predetermined level, cause the scaling module to apply the current CSI scaling factor to CSI values associated with data symbols of the received signal.

13. The CSI scaling module of claim 1, wherein the received signal is a coded orthogonal frequency division multiplexing (COFDM) signal.

14. A demodulator comprising the CSI scaling module of claim 1.

15. The CSI scaling module of claim 1, wherein the CSI scaling module is embodied in hardware on an integrated circuit.

16. A non-transitory computer readable storage medium having stored thereon a computer readable description of the CSI scaling module as set forth in claim 1 which, when processed in an integrated circuit manufacturing system, causes the integrated circuit manufacturing system to:
   process, using a layout processing system, the computer readable description of the CSI scaling module so as to generate a circuit layout description of an integrated circuit embodying the CSI scaling module; and
   manufacture, using an integrated circuit generation system, the CSI scaling module according to the circuit layout description.

17. A method for automatically scaling channel state information (CSI) comprising:
   applying a current CSI scaling factor to CSI values associated with data symbols of a signal received over a transmission channel to generate scaled CSI values;
   monitoring performance of a soft decision error corrector of a demodulator configured to demodulate the received signal, the soft decision error corrector configured to decode data carried on the data symbols of the received signal based on the scaled CSI values;
   determining whether the performance of the soft decision error corrector is below a predetermined level;
   in response to determining that the performance of the soft decision error corrector is below the predetermined level, dynamically selecting a new CSI scaling factor based on the performance of the soft decision error corrector;
   applying the new CSI scaling factor to CSI values associated with data symbols of the received signal to generate scaled CSI values; and
   providing the scaled CSI values generated by the new CSI scaling factor to the soft decision error corrector.

18. The method of claim 17, wherein dynamically selecting a new CSI scaling factor comprises:
   for each potential CSI scaling factor of a plurality of potential CSI scaling factors:
      applying the potential CSI scaling factor to at least one CSI value to generate at least one scaled value for that potential CSI scaling factor;
      providing the at least one scaled CSI value to the soft decision error corrector for use in decoding data symbols of the received signal; and
      recording the performance of the soft decision error corrector for the at least one scaled CSI value; and
   selecting the potential CSI scaling factor associated with the best performance as the new CSI scaling factor.

19. The method of claim 17, further comprising, in response to determining that the performance of the soft decision error corrector is below the predetermined level:
   determining whether the performance of the soft decision error corrector indicates that the current CSI scaling factor is far from an optimum CSI scaling factor;
   in response to determining that the performance of the soft decision error corrector indicates that the current CSI scaling factor is far from the optimum CSI scaling factor, using a first method to select the new CSI scaling factor; and
   in response to determining that the performance of the soft decision error corrector does not indicate that the current CSI scaling factor is far from the optimum CSI scaling factor, using a second method to select the new CSI scaling factor.

20. A non-transitory computer readable storage medium having stored thereon computer readable instructions that, when executed at a computer system, cause the computer system to perform the method as set forth in claim 17.

* * * * *